(12) United States Patent
Kim et al.

(10) Patent No.: US 10,347,763 B2
(45) Date of Patent: Jul. 9, 2019

(54) SEMICONDUCTOR DEVICE

(71) Applicant: Samsung Electronics Co., Ltd., Suwon-si, Gyeonggi-do (KR)

(72) Inventors: Sung Soo Kim, Hwaseong-si (KR); Dong Hyun Roh, Suwon-si (KR); Koung Min Ryu, Hwaseong-si (KR); Sang Jin Hyun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/697,678

(22) Filed: Sep. 7, 2017

(65) Prior Publication Data

US 2018/0254338 A1    Sep. 6, 2018

(30) Foreign Application Priority Data

Mar. 3, 2017   (KR) .................. 10-2017-0027698

(51) Int. Cl.
| | |
|---|---|
| *H01L 29/78* | (2006.01) |
| *H01L 29/417* | (2006.01) |
| *H01L 29/66* | (2006.01) |
| *H01L 29/423* | (2006.01) |
| H01L 27/092 | (2006.01) |
| H01L 27/12 | (2006.01) |

(52) U.S. Cl.
CPC ...... *H01L 29/785* (2013.01); *H01L 29/41791* (2013.01); *H01L 29/42376* (2013.01); *H01L 29/66545* (2013.01); *H01L 29/66795* (2013.01); H01L 27/0924 (2013.01); H01L 27/1211 (2013.01); H01L 29/7848 (2013.01); H01L 2029/7858 (2013.01)

(58) Field of Classification Search
CPC ............ H01L 29/785; H01L 29/41791; H01L 29/66795
See application file for complete search history.

(56) References Cited

U.S. PATENT DOCUMENTS

| | | | |
|---|---|---|---|
| 7,588,946 B2 | 9/2009 | Tso et al. | |
| 7,608,546 B2 | 10/2009 | Park et al. | |
| 8,334,083 B2 | 12/2012 | Luong et al. | |
| 9,263,298 B2 | 2/2016 | Matsumoto et al. | |
| 9,269,813 B2 | 2/2016 | Hong et al. | |
| 2014/0110798 A1* | 4/2014 | Cai ..................... | H01L 29/78 257/410 |
| 2015/0115216 A1 | 4/2015 | Glass et al. | |

(Continued)

FOREIGN PATENT DOCUMENTS

KR    10-2013-0136788 A    12/2013

*Primary Examiner* — Errol V Fernandes
(74) *Attorney, Agent, or Firm* — Sughrue Mion, PLLC

(57) ABSTRACT

A semiconductor device includes an active fin on a substrate, a device isolation film covering a lower portion of the active fin, a gate structure covering the active fin and the device isolation film, and a gate spacer on a side wall of the gate structure, wherein a side wall of the gate structure disposed on the device isolation film is inclined at a uniform inclination from a point higher than a half of a height of the gate structure to a bottom of the gate structure, and an inner side wall of the gate spacer on the device isolation film is inclined at a uniform inclination from a point higher than a half of a height of the gate spacer to a bottom of the gate spacer while forming an acute angle with a bottom surface of the gate spacer.

15 Claims, 28 Drawing Sheets

(56) References Cited

U.S. PATENT DOCUMENTS

| | | |
|---|---|---|
| 2015/0115363 A1 | 4/2015 | Chang et al. |
| 2016/0172496 A1 | 6/2016 | Chang et al. |
| 2016/0240630 A1 | 8/2016 | Seong et al. |
| 2017/0352656 A1* | 12/2017 | Huang ............ H01L 21/823821 |
| 2018/0102418 A1* | 4/2018 | Bih .................. H01L 21/28114 |

* cited by examiner

SEMICONDUCTOR DEVICE

CROSS-REFERENCE TO RELATED APPLICATION

This application claims priority to Korean Patent Application No. 10-2017-0027698 filed on Mar. 3, 2017 in the Korean Intellectual Property Office, the disclosure of which is incorporated herein by reference in its entirety.

FIELD

The present inventive concept relates to a semiconductor device.

BACKGROUND

As the degree of integration of semiconductor chips increases, the size of semiconductor devices becomes smaller. To overcome limitations of device characteristics (for example, short-channel effect, and the like) due to a reduction in size of semiconductor devices, a semiconductor device including a fin field effect transistor (FinFET), having a channel with a three-dimensional structure, has been proposed.

SUMMARY

An aspect of the present inventive concept may provide a semiconductor device having excellent electrical properties and a method of manufacturing the same.

According to an aspect of the present inventive concept, a semiconductor device includes an active fin extended in a first direction on a substrate, a device isolation film disposed on the substrate while covering a lower portion of the active fin, a gate structure extended in a second direction intersecting the first direction while covering the active fin and the device isolation film, and a gate spacer disposed on a side wall of the gate structure, wherein the gate structure disposed on the device isolation film has a width of a lower portion narrower than a width of an upper portion, a side wall of the gate structure disposed on the device isolation film is inclined at a uniform inclination from a point higher than a half of a height of the gate structure to a bottom of the gate structure, and an inner side wall of the gate spacer disposed on the device isolation film is disposed to be adjacent to the gate structure, and is inclined at a uniform inclination from a point higher than a half of a height of the gate spacer to a bottom of the gate spacer while forming an acute angle with a bottom surface of the gate spacer.

According to an aspect of the present inventive concept, a semiconductor device includes a substrate including a first region and a second region, a first active fin disposed on the first region of the substrate, a first device isolation film covering a lower portion of the first active fin, a first gate structure disposed on the first active fin and the first device isolation film, a first gate spacer disposed on a side wall of the first gate structure, a second active fin disposed on the second region of the substrate, a second device isolation film covering a lower portion of the second active fin, a second gate structure disposed on the second active fin and the second device isolation film, and a second gate spacer disposed on a side wall of the second gate structure, wherein a side wall of the first gate structure disposed on the first device isolation film forms a first angle with an upper surface of the substrate, a side wall of the second gate structure disposed on the second device isolation film forms a second angle with an upper surface of the substrate, the second angle is greater than the first angle, and a difference between the second angle and the first angle is in a range from 3 degrees to 8 degrees.

According to an aspect of the present inventive concept, A semiconductor device includes an active fin extended in a first direction on a substrate, a device isolation film disposed on the substrate while covering a lower portion of the active fin, a gate structure extended in a second direction, intersecting the first direction while covering the active fin and the device isolation film, and a gate spacer disposed on a side wall of the gate structure, wherein an inner side wall of the gate spacer disposed on the device isolation film is disposed to be adjacent to the gate structure, and is inclined at a uniform inclination from a point higher than half of a height of the gate spacer to a bottom of the gate spacer while forming an acute angle with a bottom surface of the gate spacer, and an outer side wall of the gate spacer disposed on the device isolation film and an upper surface of the substrate are substantially at a right angle to each other.

BRIEF DESCRIPTION OF DRAWINGS

The above and other aspects, features and other advantages of the present inventive concept will be more clearly understood from the following detailed description, taken in conjunction with the accompanying drawings, in which.

DETAILED DESCRIPTION

Embodiments of the present inventive concept will now be described in detail with reference to the accompanying drawings.

Figure 1:
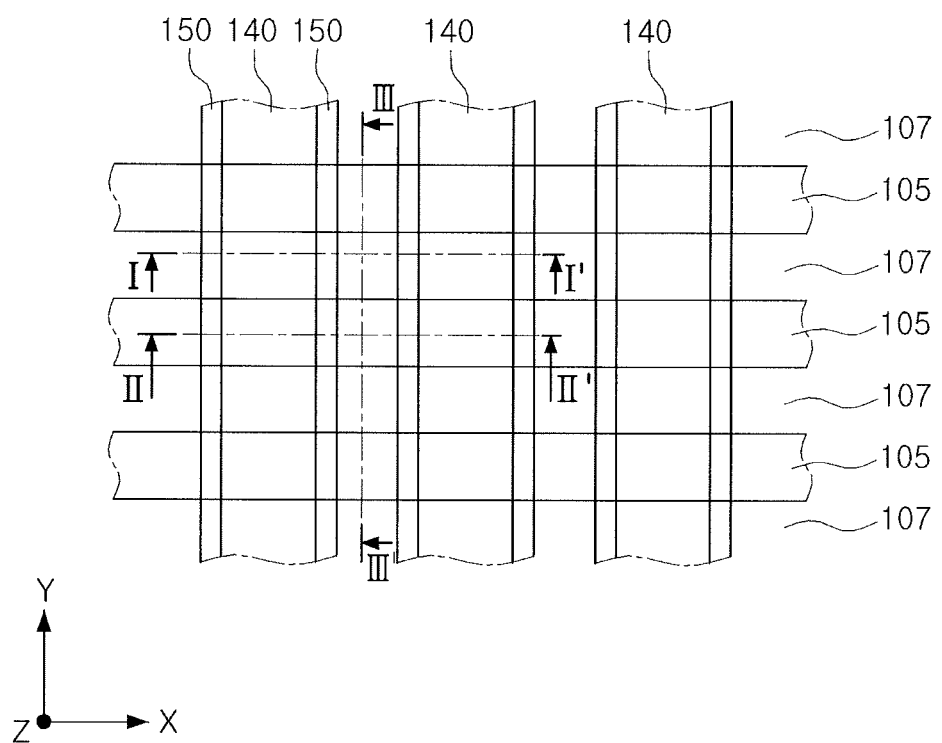
FIG. 1 is a plan view illustrating a semiconductor device according to an example embodiment.

FIG. 1 is a plan view illustrating a semiconductor device according to an example embodiment.

With reference to FIG. 1, in a semiconductor device according to an example embodiment, a plurality of active fins 105 may be disposed on a substrate, and a device isolation film 107 may be disposed between the plurality of active fins 105. A plurality of gate structures 140 intersecting the plurality of active fins 105 may be included therein. The plurality of gate structures 140 may be disposed on the device isolation film 107. The plurality of active fins 105 may be extended, for example, in a first direction (e.g., an X-axis direction). The plurality of gate structures 140 may also be extended, for example, in a second direction (e.g., a Y-axis direction). Gate spacers 150 may be disposed on side walls of the plurality of gate structures 140. Source/drain regions may be disposed on both sides of the plurality of gate structures 140.

Figure 2:
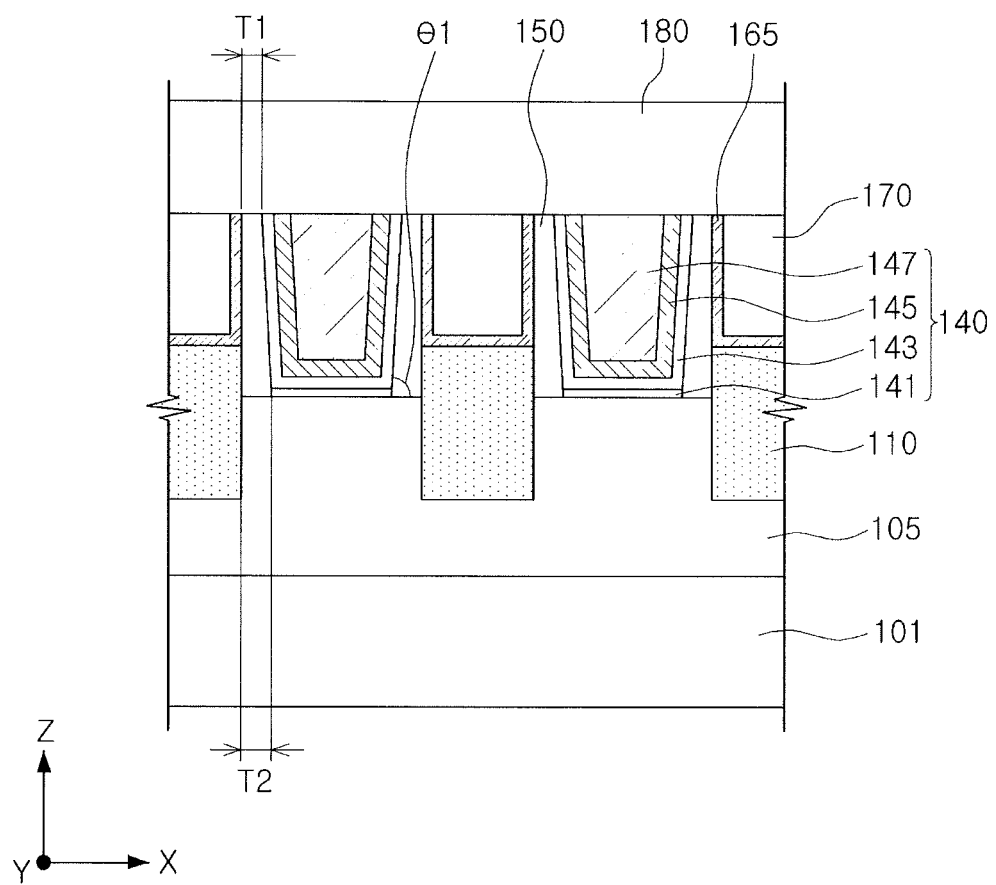
FIGS. 2 through 4 are cross-sectional views illustrating a semiconductor device according to an example embodiment.
Figure 3:
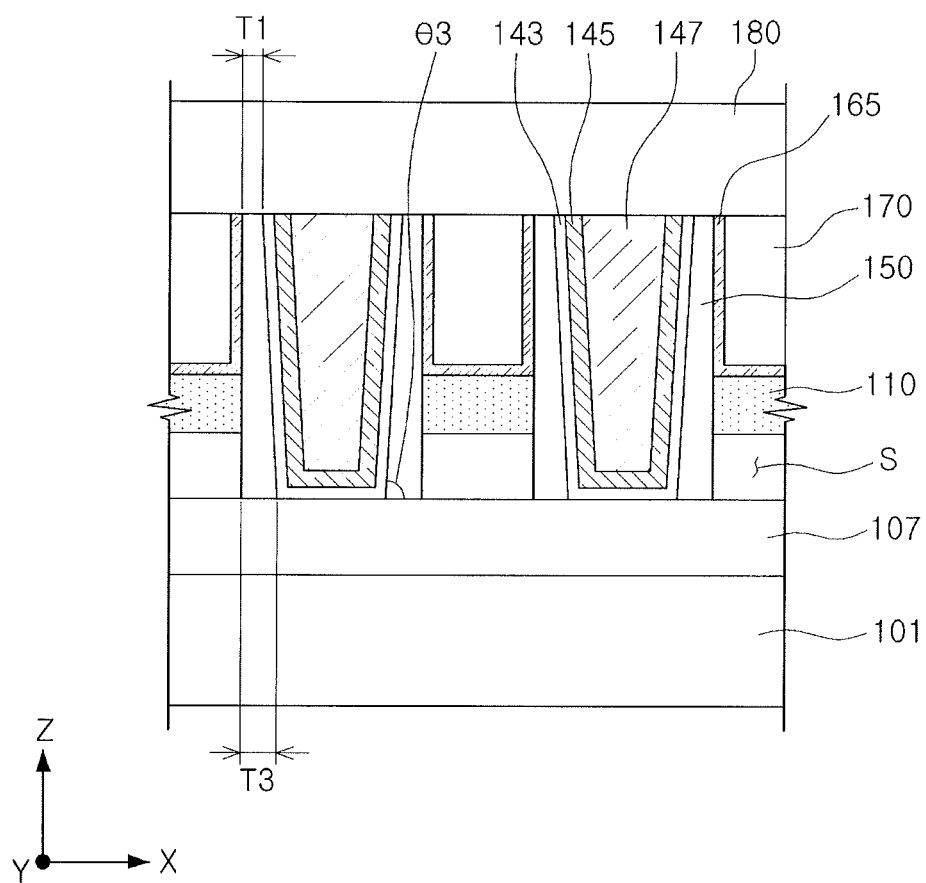
Figure 4:
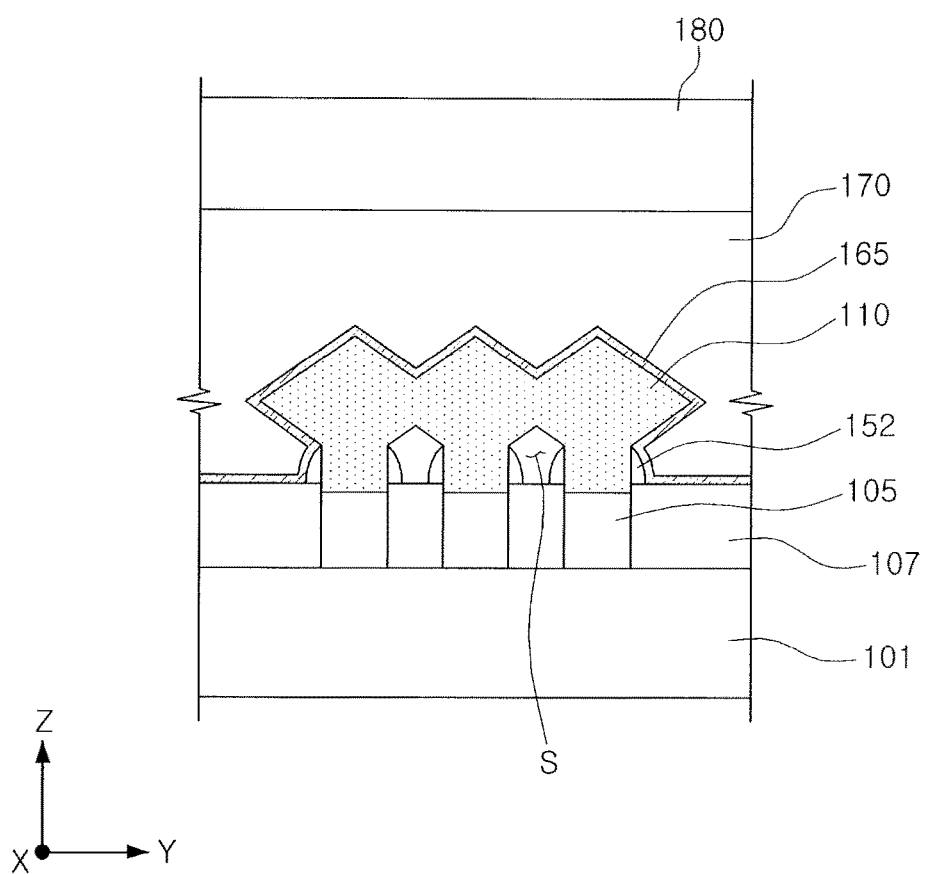

FIGS. 2 through 4 are cross-sectional views illustrating a semiconductor device according to an example embodiment. FIG. 2 is a cross-sectional view along line I-I' of FIG. 1, FIG. 3 is a cross-sectional view along line II-II' of FIG. 1, and FIG. 4 is a cross-sectional view along line III-III' of FIG. 1.

With reference to FIGS. 2 through 4, a semiconductor device according to an example embodiment may include active fins 105 extending in the first direction on a substrate 101, the device isolation film 107 disposed on the substrate 101 and covering a portion of a side surface of the active fins 105, a gate structure 140 extending in a second direction, intersecting the first direction on the active fins 105 and the device isolation film 107, and the gate spacers 150 disposed on side walls of the gate structure 140. For example, the first direction is substantially perpendicular with respect to the second direction.

The substrate 101 may include a semiconductor material, for example, a group IV semiconductor, a group III-V compound semiconductor, or a group II-VI compound semiconductor. For example, the substrate 101 may be a semiconductor substrate such as silicon, germanium, silicon-germanium, or the like, a silicon on insulator (SOI) substrate, or a germanium on insulator (GeOI) substrate. The active fins 105 may protrude from the substrate 101. The active fins 105 may be a portion of the substrate 101.

The gate structure 140 disposed on an active fin 105 may have a width of a lower portion narrower than a width of an upper portion. A side wall of the gate structure 140 disposed on the active fin 105 may be inclined at a uniform inclination from at least a point higher than a half of a height of the gate structure 140 to a bottom of the gate structure 140. The gate structure 140 disposed on the active fin 105 may have an inverted trapezoidal cross section. A side wall of the gate structure 140 disposed on the active fin 105 may form a first angle θ1 with respect to an upper surface of the substrate 101. The first angle θ1 may be an acute angle. In FIG. 2, as an upper surface of the active fin 105 is parallel to an upper surface of the substrate 101, the first angle θ1 is indicated by an angle formed by an upper surface of the active fin 105 and a side wall of the gate structure 140 for convenience of understanding. When an upper surface of the substrate 101 is parallel to a bottom surface of the gate structure 140, a side wall of the gate structure 140 disposed on the active fin 105 may form the first angle θ1 with a virtual plane extended from a bottom surface of the gate structure 140. The first angle θ1 may have a value of 80 degrees or more and 90 degrees or less. In an embodiment, the first angle θ1 may have a value of 83 degrees or more and 87 degrees or less.

Respective gate spacers 150 disposed on the active fins 105 may have a width (or a thickness) changed in a direction perpendicular to an upper surface of the substrate 101. The gate spacers 150 may have a first width T1 (or a thickness) at an upper end of a gate structure 140, and the gate spacers 150 may have a second width T2 (or a thickness) at a lower end in contact with the active fin 105. The second width T2 (or a thickness) may be greater than the first width T1 (or a thickness). Widths of the gate spacers 150 may increase toward an upper surface of the substrate. A gate spacer 150 disposed on the active fin 105 may have a first side wall (an inner side wall) and a second side wall (an outer side wall) opposing each other. The first side wall (an inner side wall), adjacent to a side wall of the gate structure 140, is inclined at a uniform inclination with respect to an upper surface of the substrate 101, and may form an acute angle with a bottom surface of the gate spacer 150. The acute angle may be substantially the same as the first angle θ1. For example, the acute angle may have a value of 83 degrees or more and 87 degrees or less. The second side wall (an outer side wall) and an upper surface of the substrate 101 are substantially at right angles to one another. In an embodiment, the second side wall may form an angle in a range from 89 degrees to 91 degrees with respect to an upper surface of the substrate 101. The gate spacer 150, disposed on the active fin 105, may have a trapezoidal cross section.

The gate structure 140, disposed on the device isolation film 107, may have a width of a lower portion narrower than a width of an upper portion. A side wall of the gate structure 140 disposed on the device isolation film 107 may be inclined at a uniform inclination from at least a point higher than a half of a height the gate structure 140 to a bottom of the gate structure 140. The gate structure 140 disposed on the device isolation film 107 may have an inverted trapezoidal cross section. A side wall of the gate structure 140 disposed on the device isolation film 107 may include a portion forming a second angle θ3 with an upper surface of the substrate 101. The second angle θ3 may be an acute angle. In FIG. 3, as an upper surface of the device isolation film 107 is parallel to an upper surface of the substrate 101, the second angle θ3 is indicated by an angle formed by an upper surface of the device isolation film 107 and a side wall of the gate structure 140 for convenience of understanding. When an upper surface of the substrate 101 is parallel to a bottom surface of the gate structure 140 disposed on the device isolation film 107, a side wall of the gate structure 140 disposed on the active fin 105 may form the second angle θ3, with a virtual plane extended from a bottom surface of the gate structure 140. The second angle θ3 may have a value of 80 degrees or more and less than 90. Specifically, the second angle θ3 may have a value of 83 degrees or more and 87 degrees or less. The first angle θ1 may be the same as the second angle θ3.

Respective gate spacers 150 disposed on the device isolation film 107 may have widths (or thicknesses) changed in a direction perpendicular to an upper surface of the substrate 101. The gate spacers 150 may have a first width T1 (or a thickness) at an upper end of the gate structure 140, and the gate spacers 150 may have a third width T3 (or a thickness) at a lower end in contact with the device isolation film 107. A third width T3 (or a thickness) may be greater than the first width T1 (or a thickness). The third width T3 (or a thickness) may be greater than the second width T2 (or a thickness). Widths of the gate spacers 150 disposed on the device isolation film 107 may increase toward to an upper surface of the substrate 101, and may be the widest in a portion in contact with the device isolation film 107. The gate spacer 150 disposed on the device isolation film 107 may have a first side wall (an inner side wall) and a second side wall (an outer side wall) opposing each other. The first side wall (an inner side wall), adjacent to a side wall of the gate structure 140, is inclined at a uniform inclination with respect to an upper surface of the substrate 101, and may form an acute angle with a bottom surface of the gate spacer 150. The acute angle may be substantially the same as the second angle θ3. For example, the acute angle may have a value of 83 degrees or more and 87 degrees or less. The second side wall (an outer side wall) and an upper surface of the substrate 101 are substantially at a right angle to one another. In some cases, the second side wall may form an angle in a range from 89 degrees to 91 degrees with respect to an upper surface of the substrate 101. The gate spacer 150 disposed on the device isolation film 107 may have a trapezoidal cross section.

The gate spacers 150 may include silicon oxide, silicon nitride, silicon oxynitride (SiON), silicon oxide containing carbon (SiOC), silicon oxynitride containing carbon (SiOCN), silicon nitride containing carbon and boron (SiBCN), or combinations thereof.

The gate structure 140 may include an interfacial insulating layer 141, a gate insulating layer 142, a first gate electrode layer 145, and a second gate electrode layer 147. The interfacial insulating layer 141 may be disposed between the active fin 105 and the gate insulating layer 142. The first gate electrode layer 145 and the second gate electrode layer 147 may form a gate electrode layer.

The gate insulating layer 142 may conformally cover an inner side wall of the gate spacer 150 and an upper surface of the active fin 105 on the active fin 105. The gate insulating layer 142 may conformally cover an inner side wall of the gate spacer 150 and an upper surface of the device isolation film 107 on the device isolation film 107. The first gate electrode layer 145 may conformally cover the gate insulating layer 142. The second gate electrode layer 147 may be formed on the first gate electrode layer 145.

The interfacial insulating layer 141 may include silicon oxide, and the gate insulating layer 143 may include a high-k insulating material. The high-k insulating material may refer to a dielectric material having a dielectric constant higher than that of silicon oxide. The high-k insulating material may include, for example, aluminum oxide (Al2O3), tantalum oxide (Ta2O3), titanium oxide (TiO2), yttrium oxide (Y2O3), zirconium oxide (ZrO2), zirconium silicon oxide (ZrSixOy), hafnium oxide (HfO2), hafnium silicon oxide (HfSixOy), lanthanum oxide (La2O3), lanthanum aluminum oxide (LaAlxOy), lanthanum hafnium oxide (LaHfxOy), hafnium aluminum oxide (HfAlxOy), or praseodymium oxide (Pr2O3).

The first gate electrode layer 145 may include, for example, at least one selected from the group consisting of titanium nitride (TiN), tantalum nitride (TaN), tungsten nitride (WN), titanium aluminum nitride (TiAlN), titanium aluminum (TiAl), tantalum carbide (TaC), and titanium carbide (TiC). The second gate electrode layer 147 may include, for example, a metallic material such as aluminum (Al), tungsten (W), or molybdenum (Mo), or a semiconductor material such as doped polysilicon.

The semiconductor device may include source/drain regions 110 disposed on both sides of gate structures 140. The source/drain regions 110 may have portions connected to each other or merged with each other between the active fins 105 adjacent to each other, and a void S may be formed between a merged portion and the device isolation film 107. As described above, a side wall of the gate structure 140, disposed to be adjacent to the void on the device isolation film 107, may include a portion forming the second angle θ3 with an upper surface of the substrate 101.

The source/drain regions 110 may be formed of, for example, silicon or silicon-carbon (SiC) doped at a high concentration of an n-type impurity. Alternatively, the source/drain regions 110 may be formed of silicon-germanium (SiGe) doped at a high concentration of a p-type impurity.

The semiconductor device may include an etch stop layer 165 covering a side wall of the gate spacer 150 and an upper surface of the source/drain regions 110, and may include a first interlayer insulating layer 170 disposed on the etch stop layer 165. In addition, the semiconductor device may include a second interlayer insulating layer 180, covering the first interlayer insulating layer 170 and the gate structure 140.

The etch stop layer 165 may include silicon nitride, and the first interlayer insulating layer 170 and the second interlayer insulating layer 180 may include silicon oxide.

According to an example embodiment, widths of the gate spacers 150, adjacent to the device isolation film 107, are formed to be thick, so that an electrical short failure between gate electrode layers including the first gate electrode layer 145 and the second gate electrode layer 147 and a source/drain region 110, can be prevented.

Figure 5:
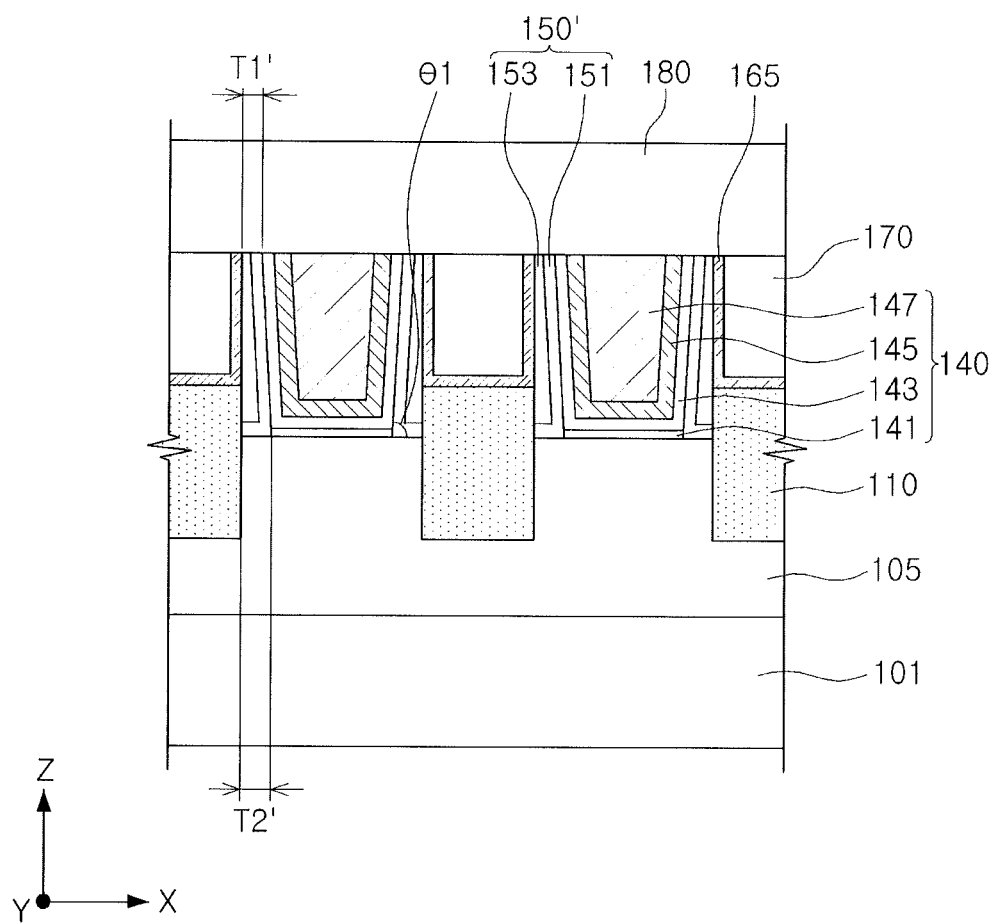
FIGS. 5 and 6 are cross-sectional views illustrating a semiconductor device according to an example embodiment.
Figure 6:
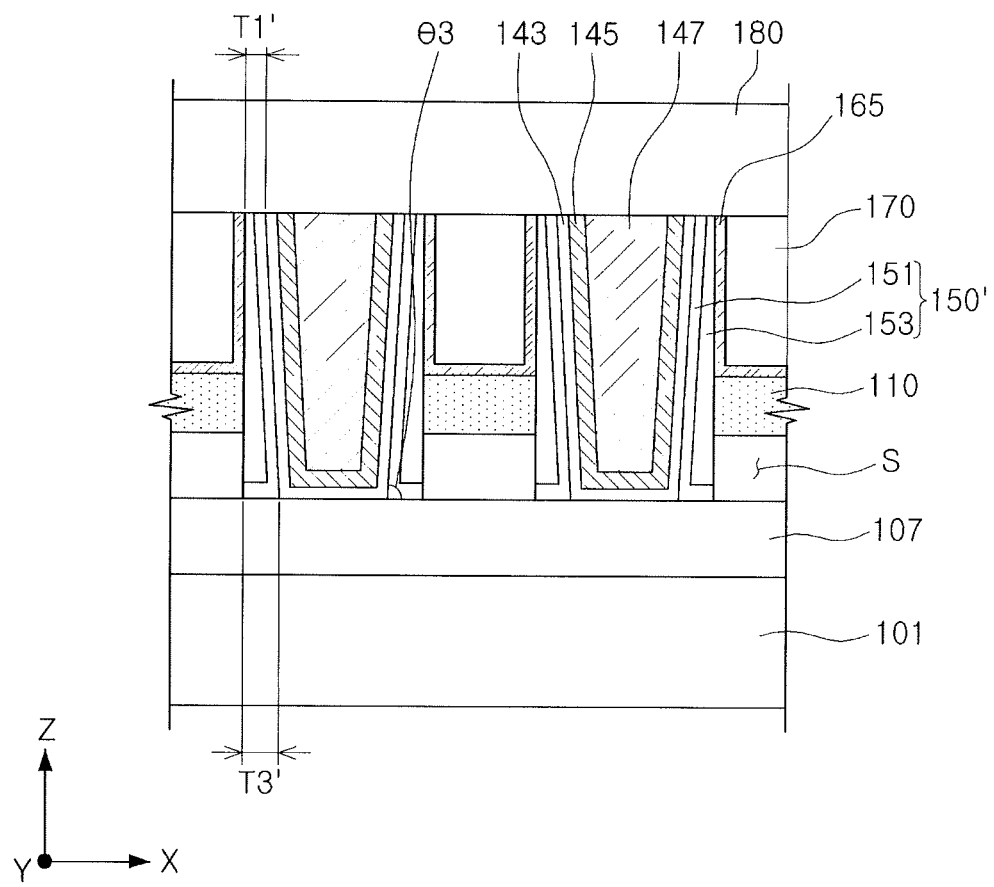

FIGS. 5 and 6 are cross-sectional views illustrating a semiconductor device according to an example embodiment. FIG. 5 is a cross-sectional view cut along line I-I' of FIG. 1, and FIG. 6 is a cross-sectional view cut along line II-II' of FIG. 1.

With reference to FIGS. 5 and 6, a semiconductor device according to an example embodiment may include active fins 105 extended in a first direction on a substrate 101, a device isolation film 107 disposed on the substrate 101 while covering a portion of a side surface of the active fins 105, a gate structure 140 extended in a second direction intersecting the first direction on the active fins 105 and the device isolation film 107, and gate spacers 150' disposed on a side wall of the gate structure 140.

Each of the gate spacers 150' may include a first spacer 151 adjacent to the gate structure 140, and a second spacer 153, disposed on an outer side wall of the first spacer 151.

The first spacer 151 has a structure bent at a boundary of the gate structure 140 and the active fin 105, and a width of the second spacer 153 may increase toward the active fin 105.

The first spacer 151 has a structure bent at a boundary of the gate structure 140 and the device isolation film 107, and a width of the second spacer 153 may increase toward the device isolation film 107.

An angle in which the first spacer 151 is bent may have a value of 83 degrees or more and 87 degrees or less.

The first spacer 151 and the second spacer 153 may include silicon oxide (SiOx), silicon nitride (SixNy), silicon oxynitride (SiON), silicon oxide containing carbon (SiOC), silicon oxynitride containing carbon (SiOCN), silicon nitride containing carbon and boron (SiBCN), or combinations thereof.

Figure 7:
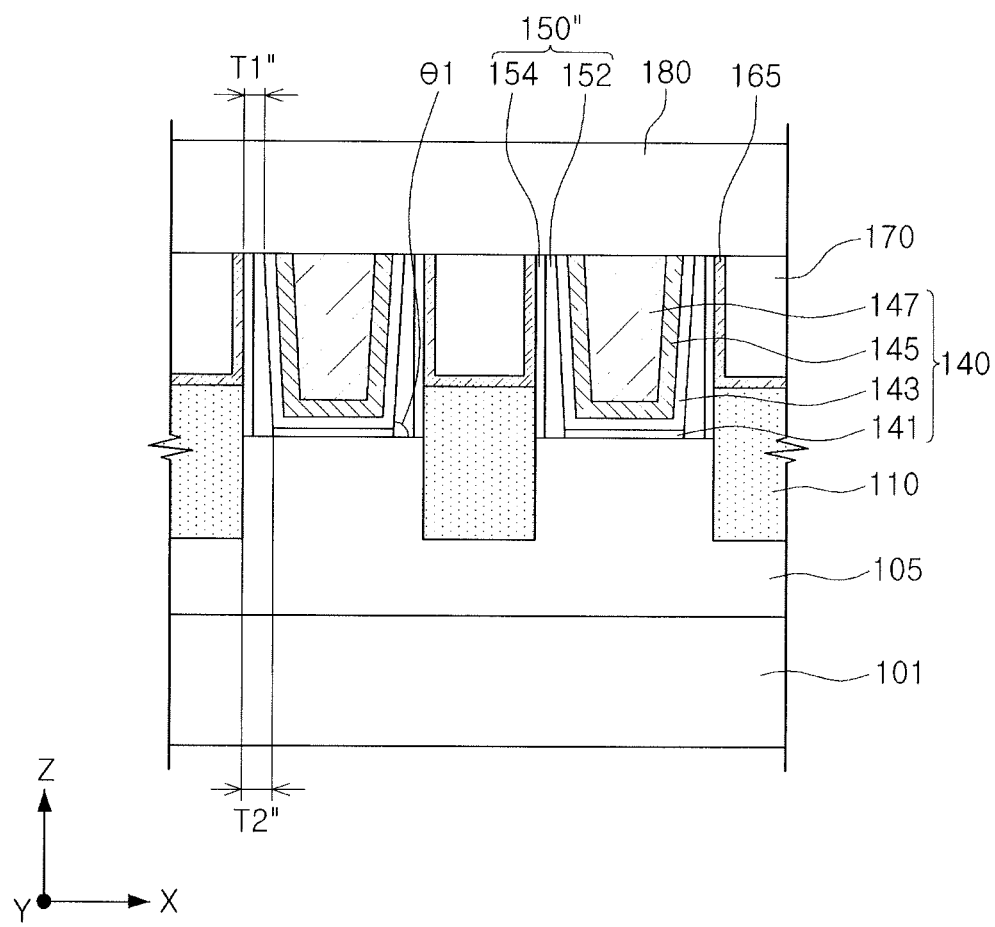
FIGS. 7 and 8 are cross-sectional views illustrating a semiconductor device according to an example embodiment.
Figure 8:
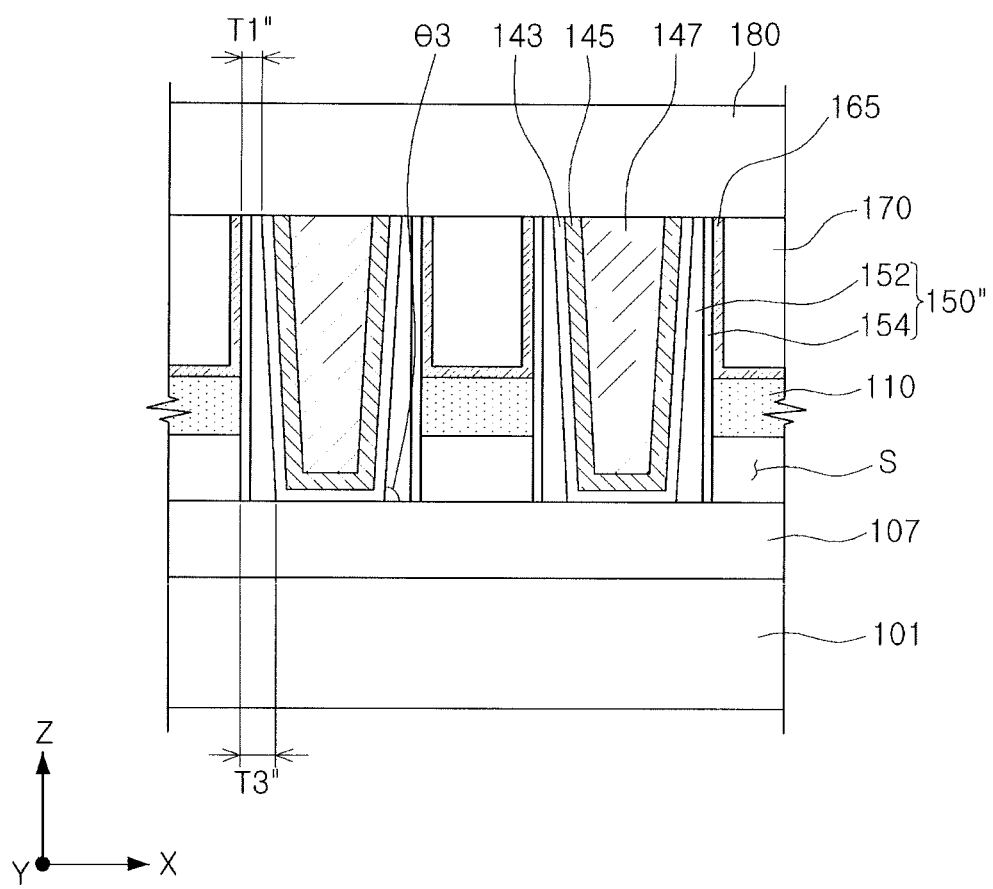

FIGS. 7 and 8 are cross-sectional views illustrating a semiconductor device according to an example embodiment. FIG. 7 is a cross-sectional view cut along line I-I' of FIG. 1, and FIG. 8 is a cross-sectional view cut along line II-II' of FIG. 1.

Each of gate spacers 150" may include a first spacer 152 adjacent to the gate structure 140, and a second spacer 154 disposed on an outer side wall of the first spacer 152.

A width of the first spacer 152 disposed on the active fin 105 may increase toward the active fin 105, and a width of the second spacer 154 may be uniform.

A width of the first spacer 152 disposed on the device isolation film 107 may increase toward the device isolation film 107, and a width of the second spacer 154 may be uniform.

An inner side wall of the first spacer 152 is inclined at a uniform inclination with respect to an upper surface of the substrate and may form an acute angle with an upper surface of the substrate 101. The acute angle may have a value of 83 degrees or more and 87 degrees or less.

The first spacer 152 and the second spacer 154 may include silicon oxide (SiOx), silicon nitride (SixNy), silicon oxynitride (SiON), silicon oxide containing carbon (SiOC), silicon oxynitride containing carbon (SiOCN), silicon nitride containing carbon and boron (SiBCN), or combinations thereof.

Figure 9:
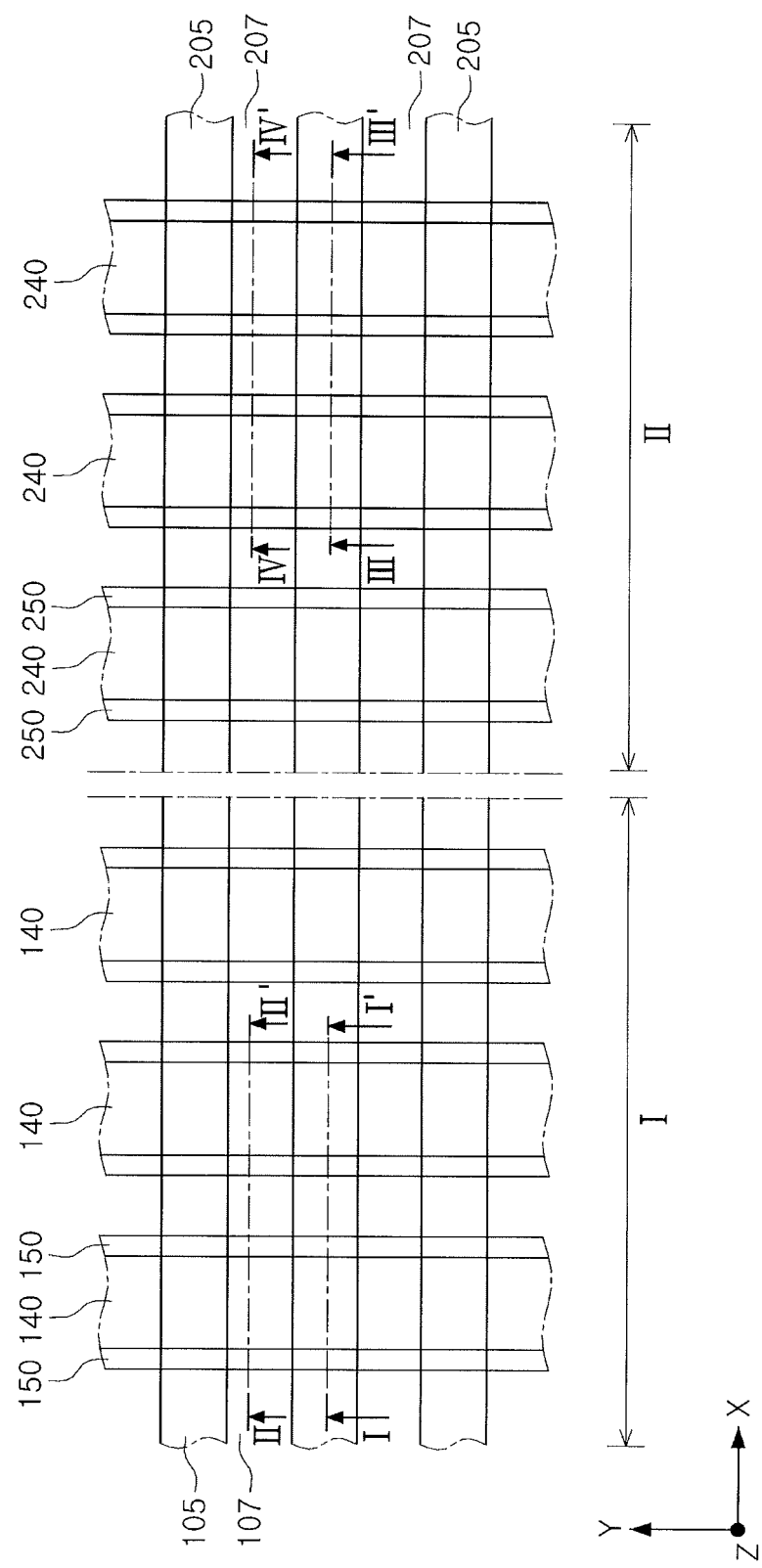
FIG. 9 is a plan view illustrating a semiconductor device according to an example embodiment.

FIG. 9 is a plan view illustrating a semiconductor device according to an example embodiment.

With reference to FIG. 9, in the case of a semiconductor device according to an example embodiment, a plurality of first active fins 105 may be disposed on a first region I of a substrate, and a first device isolation film 107 may be disposed between the plurality of first active fins 105. A plurality of first gate structures 140, formed to intersect the plurality of first active fins 105, may be included therein. The plurality of first gate structures 140 may be disposed on the first device isolation film 107. The plurality of first active fins 105 may be extended, for example, in a first direction (an X-axis direction). The plurality of first gate structures 140 may also be extended, for example, in a second direction (a Y-axis direction). First gate spacers 150 may be disposed on a side wall of the plurality of first gate structures 140. First source/drain regions (not shown) may be disposed on both sides of the plurality of first gate structures 140.

A plurality of second active fins 205 may be disposed on a second region II of the substrate, and a second device isolation film 207 may be disposed between the plurality of second active fins 205. A plurality of second gate structures 240, formed to intersect the plurality of second active fins 205, may be included therein. The plurality of second gate structures 240 may be disposed on the second device isolation film 207. The plurality of second active fins 205 may be extended, for example, in a first direction (an X-axis direction). The plurality of second gate structures 240 may be extended, for example, in a second direction (a Y-axis direction). Second gate spacers 250 may be disposed on a side wall of the plurality of second gate structures 240. Second source/drain regions may be disposed in both sides of the plurality of second gate structures 240.

Figure 10:
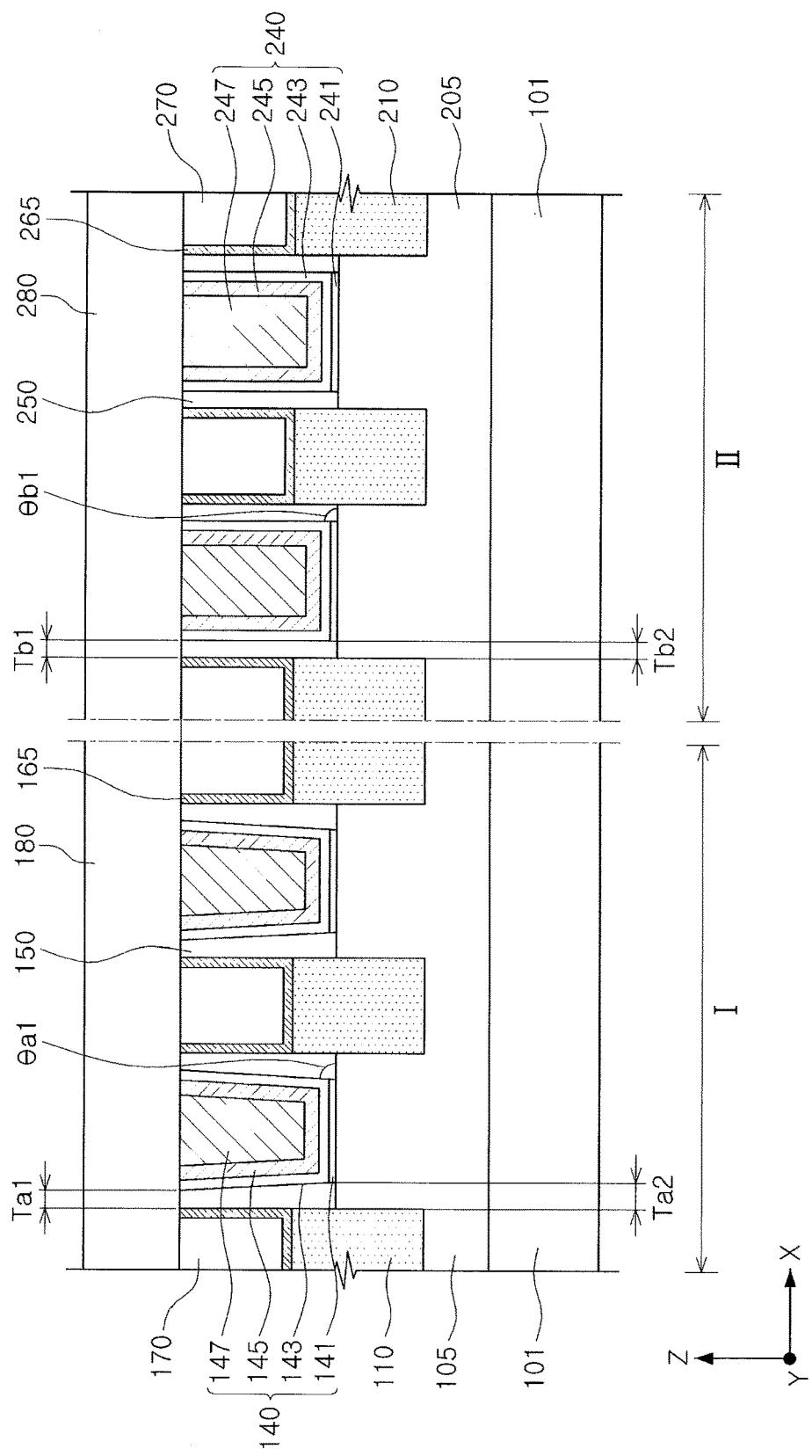
FIGS. 10 and 11 are cross-sectional views illustrating a semiconductor device according to an example embodiment.
Figure 11:
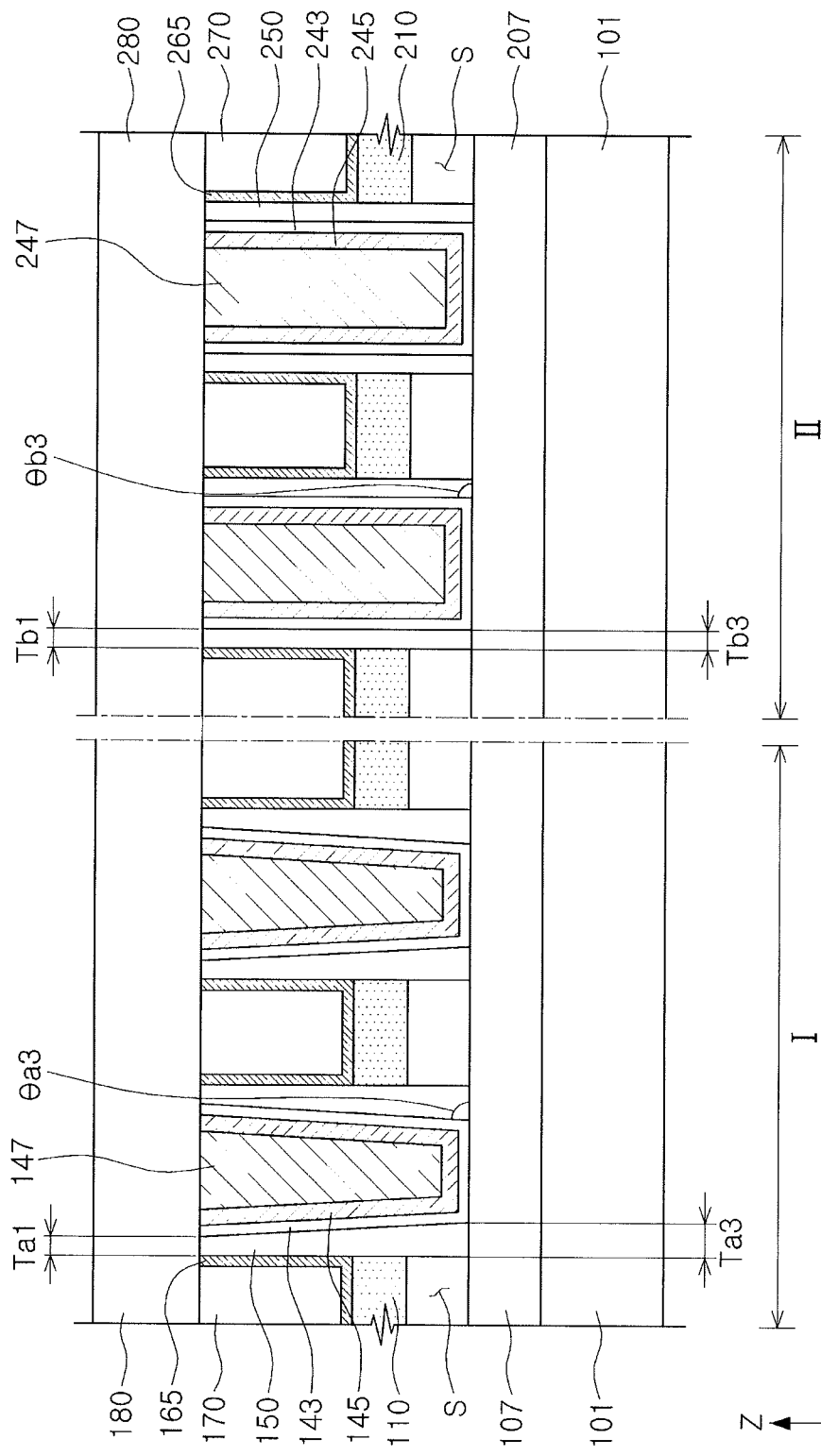

FIGS. 10 and 11 are cross-sectional views illustrating a semiconductor device according to an example embodiment. FIG. 10 is a cross-sectional view cut along line I-I' of FIG. 9, and FIG. 11 is a cross-sectional view cut along line II-II' of FIG. 9. Transistors disposed in the first region I of the semiconductor device illustrated in FIGS. 10 and 11, are the same those illustrated in FIGS. 2 and 3.

With reference to FIGS. 10 and 11, a substrate 101 may include a first region I and a second region II. First transistors disposed in the first region I of the substrate 101 may be, for example, an n-type Fin Field Effect Transistor (FinFET), and second transistors disposed in the second region II of the substrate 101 may be, for example, a p-type Fin Field Effect Transistor (FinFET). Alternatively, first transistors disposed in the first region I of the substrate 101 may be, for example, a p-type FinFET, and second transistors disposed in the second region II of the substrate 101 may be, for example, an n-type FinFET.

The semiconductor device may include first active fins 105, disposed on the first region I of the substrate 101, a first device isolation film 107 covering a lower portion of the first active fins 105, a first gate structure 140 disposed on the first active fins 105 and the first device isolation film 107, first gate spacers 150 disposed on a side wall of the first gate structure 140, second active fins 205 disposed on the second region II of the substrate 101, a second device isolation film 207 covering a lower portion of the second active fins 205, a second gate structure 240 disposed on the second active fins 205 and the second device isolation film 207, and second gate spacers 250 disposed on a side wall of the second gate structure 240. A side wall of the first gate structure 140 disposed on a first active fin 105 may form a first angle $\theta a1$ with an upper surface of the substrate 101, and a side wall of the second gate structure 240 disposed on a second active fin 205 forms a third angle $\theta b1$ with an upper surface of the substrate 101. The first angle $\theta a1$ may be an acute angle, and may have a value of 80 degrees or more or less than 90 degrees. In an embodiment, the first angle $\theta a1$ may have a value of 83 degrees or more and 87 degrees or less. The third angle $\theta b1$ may have a value from 89 degrees to 91 degrees. A side wall of the first gate structure 140 disposed on the first device isolation film 107 may form a second angle $\theta a3$ with an upper surface of the substrate 101, and a side wall of the second gate structure 240 disposed on the second device isolation film 207 may form a fourth angle $\theta b3$ with an upper surface of the substrate 101. A side wall of the first gate structure 140, disposed on the first device isolation film 107, may form a second angle $\theta a3$ with an upper surface of the substrate 101, and a side wall of the second gate structure 240, disposed on the second device isolation film 207, may form a fourth angle $\theta b3$ with an upper surface of the substrate 101. The second angle $\theta a3$ may be an acute angle, and may have a value of 80 degrees or more and less than 90 degrees. In an embodiment, the second angle $\theta a3$ may have a value of 83 degrees or more and 87 degrees or less. The fourth angle $\theta b3$ may have a value from 89 degrees to 91 degrees. A difference between the fourth angle $\theta b3$ and the second angle $\theta a3$ may be in a range from 3 degrees to 8 degrees. A difference between the fourth angle $\theta b3$ and the second angle $\theta a3$ may preferably be in a range from 4 degrees to 7 degrees.

Each of the first gate spacers 150 has a width which increases toward an upper surface of the substrate 101, and each of the second gate spacers 250 may have a uniform width. In the case of the first gate spacers 150, a first width Ta1 at an upper end of a gate structure 104 may be the smallest, and a third width Ta3 at a lower end in contact with the device isolation film 107 may be the largest. In the case of the second gate spacers 250, a first width Tb1, a second width Tb2, and a third width Tb3 may be substantially the same. The first width Tb1 of the second gate spacers 250 may be thicker than the first width Ta1 of the first gate spacers 150.

Figure 12:
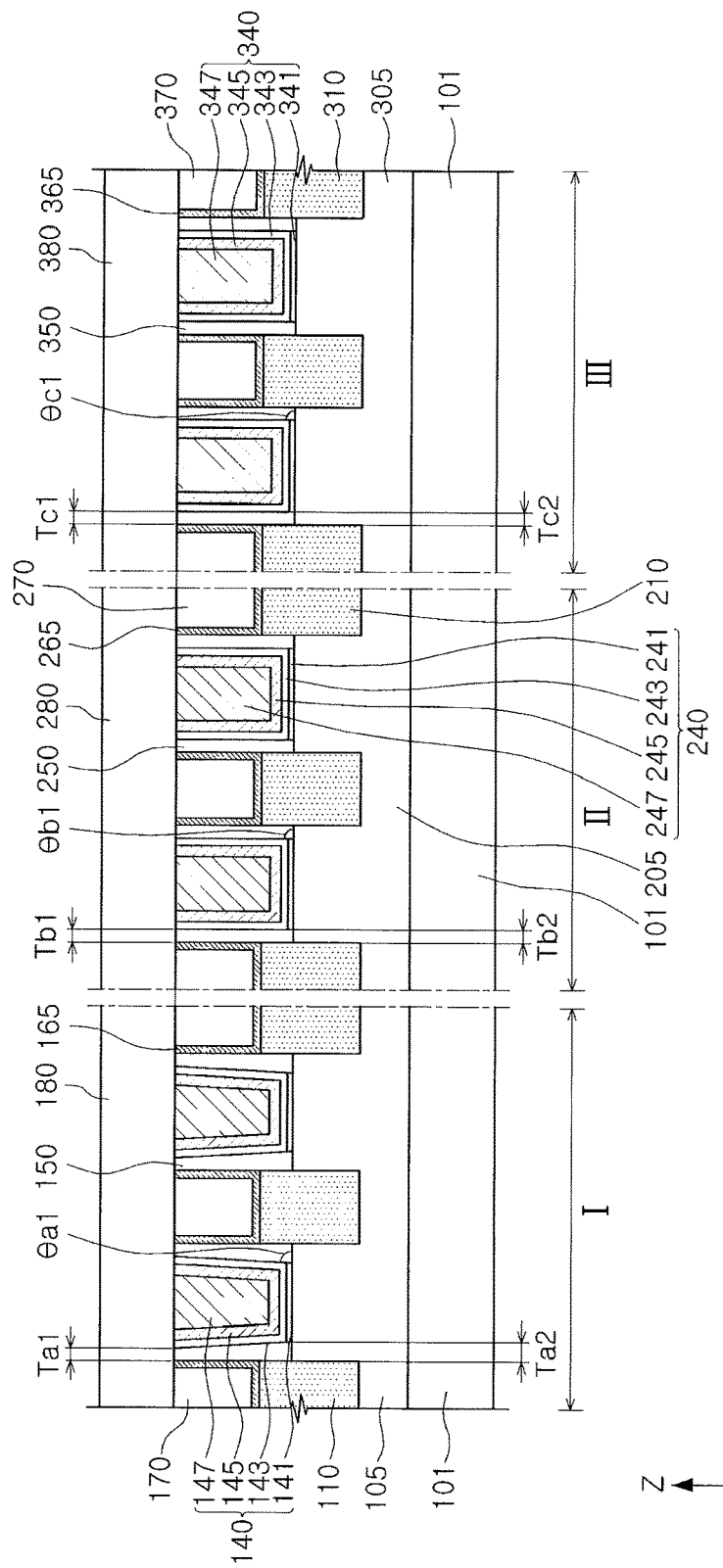
FIGS. 12 and 13 are cross-sectional views illustrating a semiconductor device according to an example embodiment.
Figure 13:
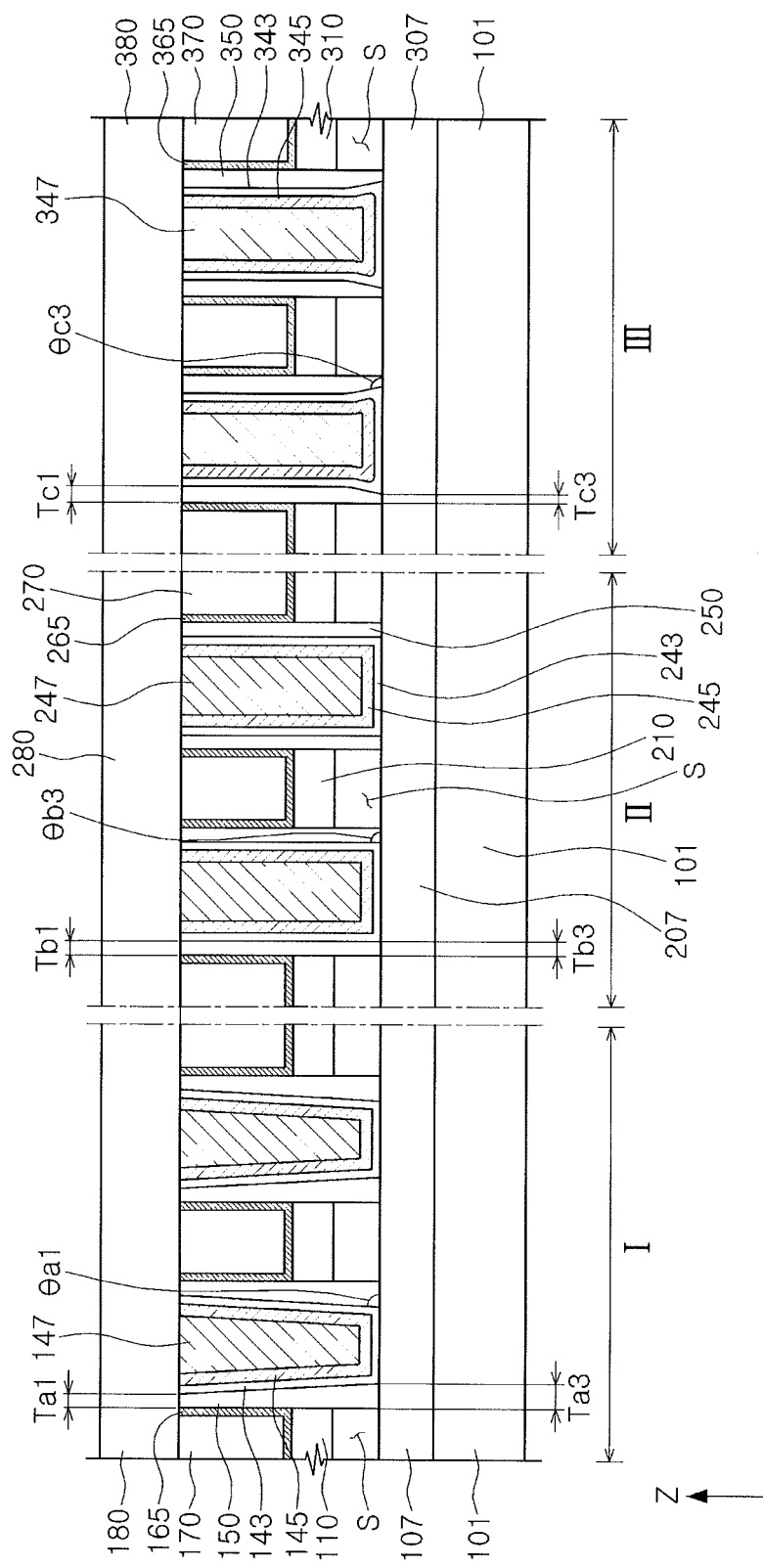

FIGS. 12 and 13 are cross-sectional views illustrating a semiconductor device according to an example embodiment. Transistors disposed in a first region I of the semiconductor device illustrated in FIGS. 12 and 13 have the same structure as the transistors illustrated in FIGS. 2 and 3, while transistors disposed in a second region II have the same structure as the transistors illustrated in FIGS. 10 and 11.

With reference to FIGS. 12 and 13, a substrate 101 may include the first region I, the second region II, and the third region III.

The semiconductor device may include third active fins 305 disposed on the third region III of the substrate 101, a third device isolation film 307 covering a lower portion of the third active fins 305, a third gate structure 340 disposed on the third active fins 305 and the third device isolation film 307, and third gate spacers 350 disposed on a side wall of the third gate structure 340.

A side wall of the third gate structure 340 disposed on a third active fin 305 may form a fifth angle $\theta c1$ with an upper surface of the substrate 101. The fifth angle $\theta c1$ may have a range from 89 degrees to 91 degrees.

A side wall of the third gate structure 340 disposed on the third device isolation film 307 may include a lower region forming a sixth angle θc3 with an upper surface of the substrate 101. In the third gate structure 340, a width of a lower portion may be wider than a width of an upper portion. The third gate structure 340 may include an upper region having a uniform width, and the lower region in which a width gradually increases.

The sixth angle θc3 may be greater than the fourth angle θb3, may be an obtuse angle, and may be greater than 90 degrees and less than 100 degrees.

A third gate spacer 350 may have a shape in which a width of a lower portion is smaller than a width of an upper portion. The third gate spacer 350 may include an upper region having a uniform width and a lower region in which a width gradually increases.

In an example embodiment, the semiconductor device does not have a transistor structure disposed in the second region II, and may have a transistor structure illustrated in the first region I and a transistor structure illustrated in the third region III.

FIGS. 14 through 30 are cross-sectional views illustrating a method of manufacturing a semiconductor device according to an example embodiment. FIGS. 14, 17, 20, 23, 26, and 29 are cross-sectional views corresponding to FIG. 2. FIGS. 15, 18, 21, 24, 27, and 30 are cross-sectional views corresponding to FIG. 3. FIGS. 16, 19, 22, 25, and 28 are cross-sectional views corresponding to FIG. 4.

Figure 14:
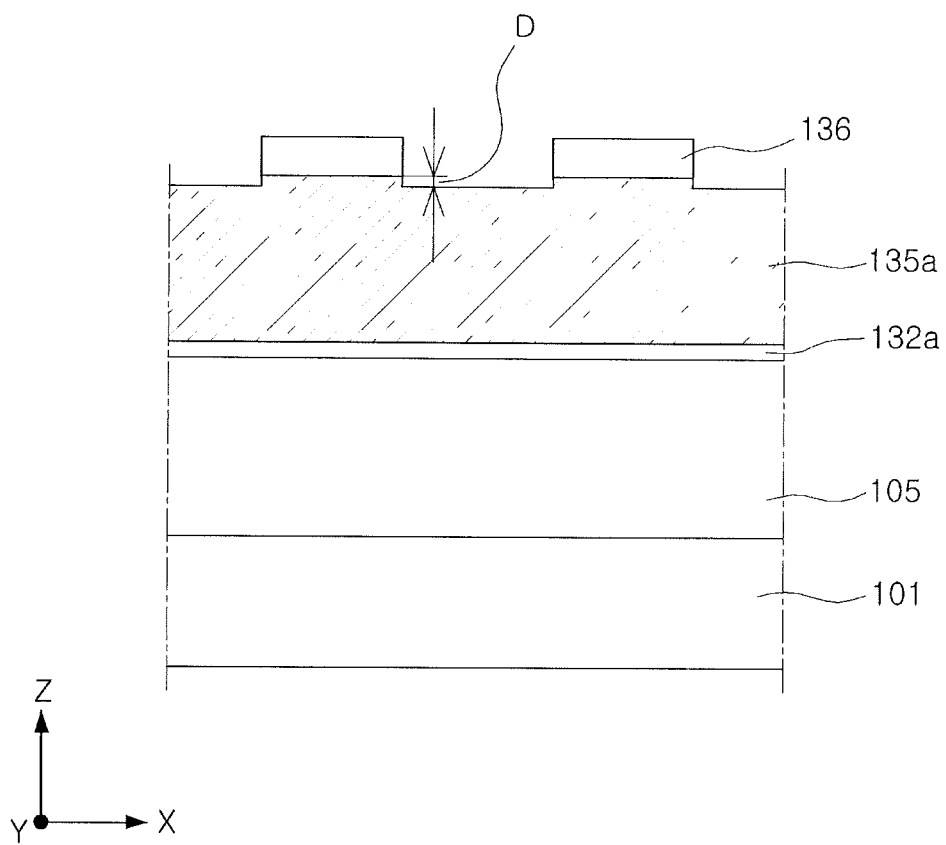
FIGS. 14 through 30 are cross-sectional views illustrating a method of manufacturing a semiconductor device according to an example embodiment.
Figure 15:
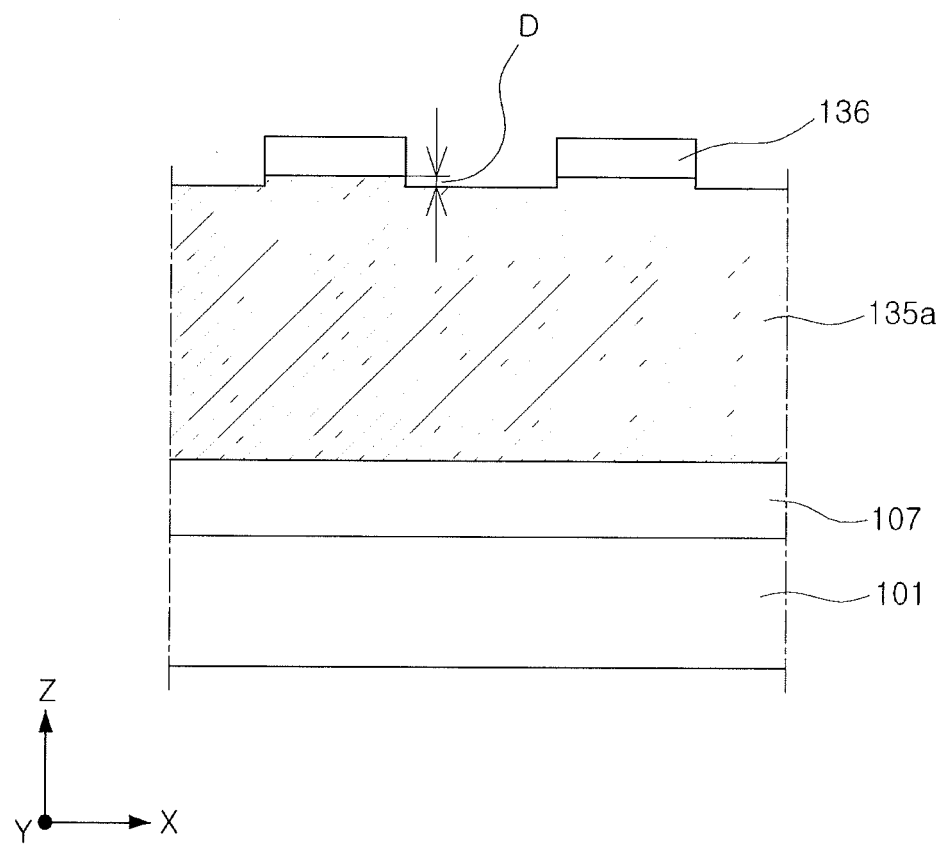
Figure 16:
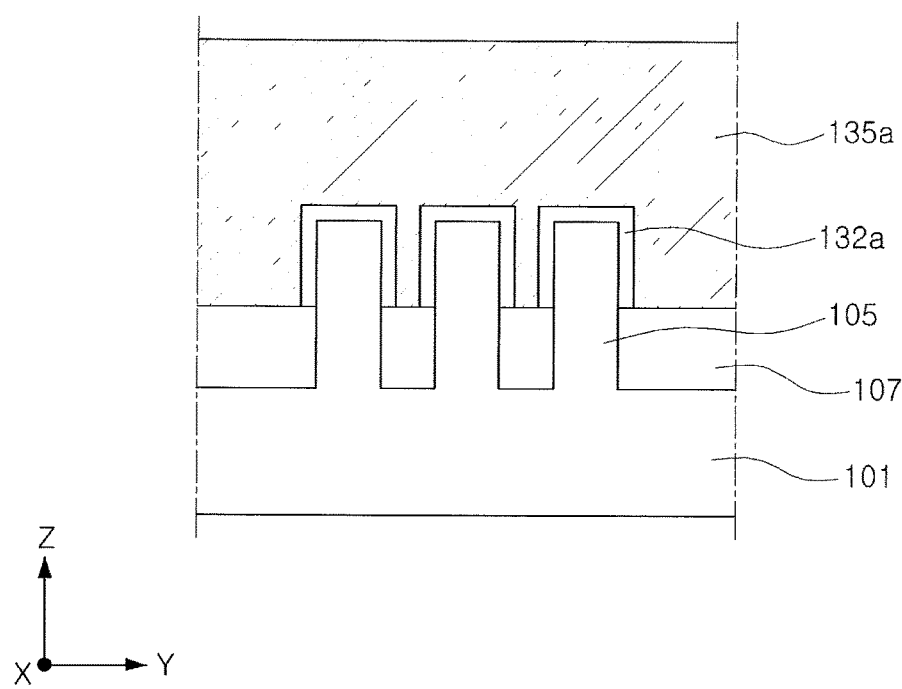

With reference to FIGS. 14 through 16, active fins 105 and a device isolation film 107 are formed on a substrate 101, and a sacrificial gate insulating layer 132a and a sacrificial gate electrode layer 135a may be formed thereon. Further, a gate mask pattern 136 may be formed on the sacrificial gate electrode layer 135a.

The substrate 101 may include a single crystal semiconductor substrate, such as a silicon wafer or a silicon on insulator (SOI) wafer. The substrate 101 may include a group IV-IV compound semiconductor, a group III-V compound semiconductor, or a group II-VI compound semiconductor.

Mask patterns are formed on the substrate 101, and the mask patterns are used as an etching mask to etch the substrate 101, so that the active fins 105 may be formed. In an etching process described above, trenches may be formed between the active fins 105. The trenches may include deep trenches (not shown) and shallow trenches. The active fins 105 may be formed on the substrate 101 in parallel to each other. The active fins 105 may be extended in a first direction (for example, an X-axis direction). The active fins 105 may be a portion of the substrate 101.

A lower portion of the shallow trenches are embedded with an insulating material, so the device isolation film 107 may be formed. As a result, an upper portion of the active fins 105 may protrude above the device isolation film 107. The device isolation film 107 may fill a portion of the shallow trenches, and may cover a portion of a side surface of the active fins 105. The deep trenches may be completely filled with the device isolation film 107. In FIG. 16, an upper surface of the device isolation film 107 is illustrated as flat, but the upper surface of the device isolation film 107 may have a concave shape.

After the sacrificial gate insulating layer 132a covering the active fins 105 and the sacrificial gate electrode layer 135a are sequentially formed, gate mask patterns 136 may be formed on the sacrificial gate electrode layer 135a. In this case, an anisotropic etching process of forming the gate mask patterns 136 may include a main etch process and an overetch process, and the overetch process may be performed to allow an upper surface of the sacrificial gate electrode layer 135a to be etched to a depth D of 3 nm or less. The overetch process is reduced to allow the upper surface thereof to be etched to the depth D of 3 nm or less, so a width of an upper portion of a sacrificial gate may be increased in a subsequent etching process of a sacrificial gate pattern. A width of the gate mask patterns 136 in a first direction (for example, an X-axis direction) may be in a range from 21 nm to 24 nm. The gate mask patterns 136 may be extended in a second direction (for example, a Y-axis direction). The sacrificial gate insulating layer 132a may be formed in an oxidation process, and the sacrificial gate insulating layer 132a may be formed on only surfaces of the active fins 105 protruding above the device isolation film 107. Alternatively, the sacrificial gate insulating layer 132a may be formed in a chemical vapor deposition (CVD) or an atomic layer deposition (ALD) process, and the sacrificial gate insulating layer 132a may be formed on surfaces of the active fins 105 and the device isolation film 107. For example, the sacrificial gate insulating layer 132a may include silicon oxide, and the sacrificial gate electrode layer 135a may include polysilicon. The gate mask patterns 136 may include silicon nitride. In FIG. 16, edges of an upper portion of the active fins 105 are illustrated as having an angular shape, but the edges of an upper portion thereof may be curved.

Figure 17:
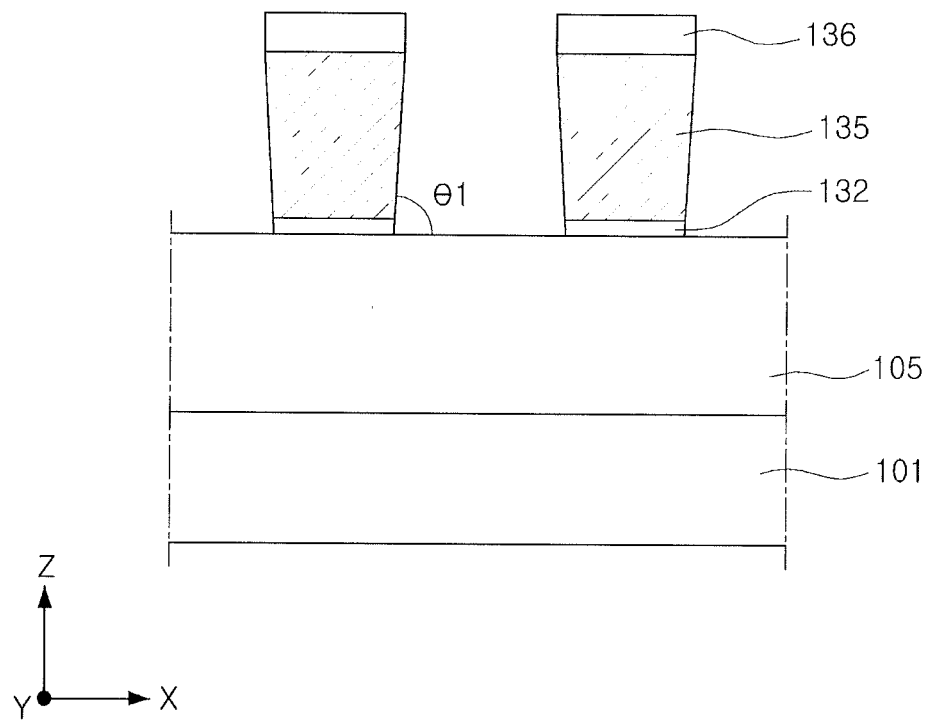
Figure 18:
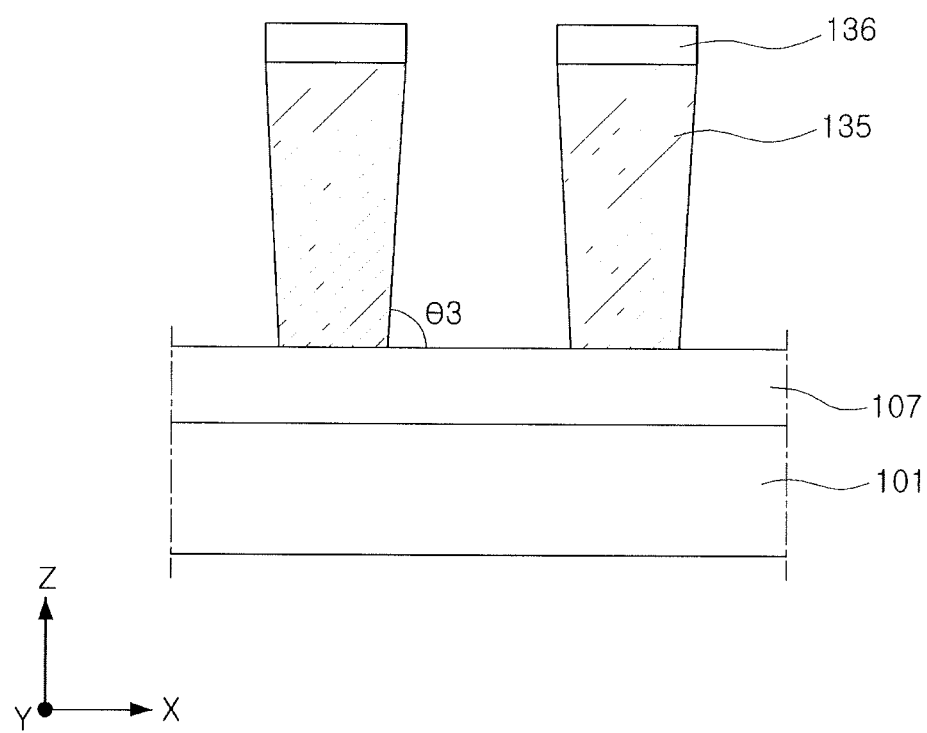
Figure 19:
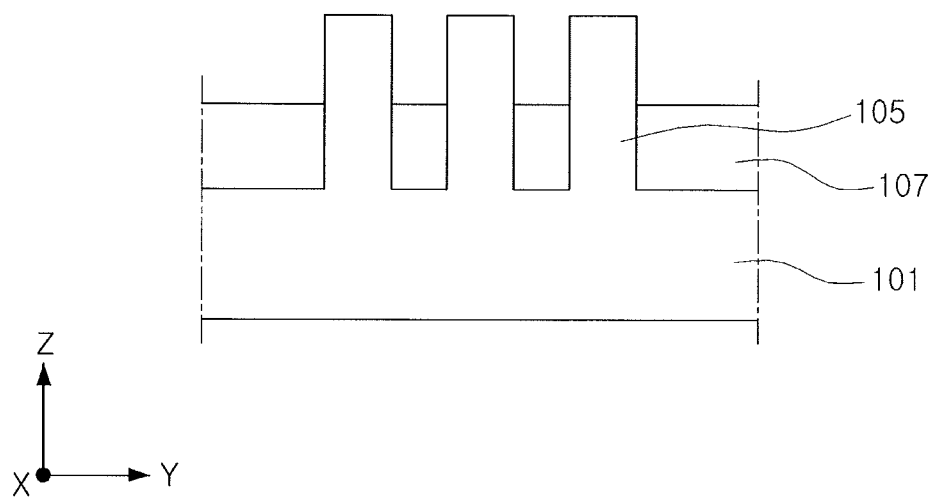

With reference to FIGS. 17 through 19, the gate mask patterns 136 are used as an etching mask to anisotropically etch the sacrificial gate electrode layer 135a and the sacrificial gate insulating layer 132a, so that sacrificial gate patterns 135 and sacrificial gate insulating patterns 132 may be formed. The sacrificial gate patterns 135 may be extended in the second direction while covering the active fins 105 and the device isolation film 107. The sacrificial gate insulating layer 132a may be completely removed from the active fins 105, between the sacrificial gate patterns 135. Alternatively, the sacrificial gate insulating layer 132a may remain on the active fins 105 between the sacrificial gate patterns 135.

The anisotropic etching process of forming a sacrificial gate pattern 135 and a sacrificial gate insulating pattern 132 may be performed at a substrate temperature of 40° C. to 80° C., more preferably at a substrate temperature of 50° C. to 70° C. As an etching process is performed at a substrate temperature in a range described above, both side walls of the sacrificial gate pattern 135 disposed on the active fin 105 may form an acute angle θ1 with an upper surface of the substrate 101. As illustrated in FIG. 13, when an upper surface of the active fins 105 is parallel to an upper surface of the substrate 101, both side walls may form the acute angle θ1 with an upper surface of the active fins 105. As an etching process is performed at a substrate temperature in the range described above, both side walls of the sacrificial gate pattern 135 disposed on the device isolation film 107 may form an acute angle θ3 with an upper surface of the substrate 101. As illustrated in FIG. 14, when an upper surface of the device isolation film 107 is parallel to an upper surface of the substrate 101, both side walls may form the acute angle θ3 with an upper surface of the device isolation film 107. For example, acute angle θ1 and acute angle θ3 may be the same, and may have a range of 80 degrees or more and less than 90 degrees. The sacrificial gate patterns 135 may have an inverted trapezoidal cross section in which a width of a lower portion is narrower than a width of an upper portion.

Figure 20:
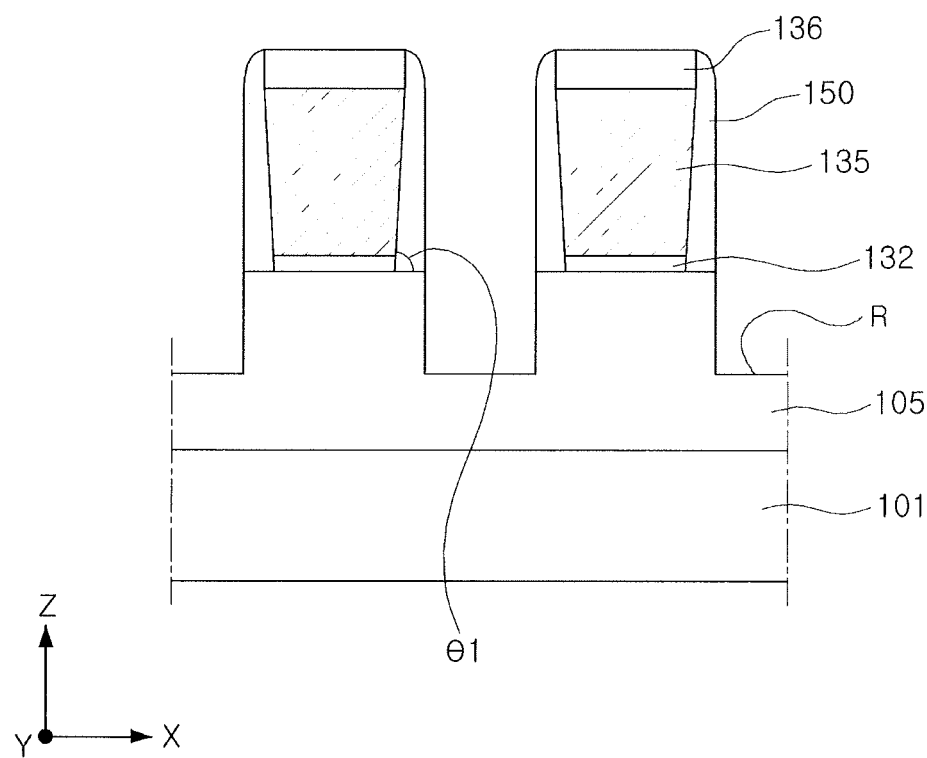
Figure 21:
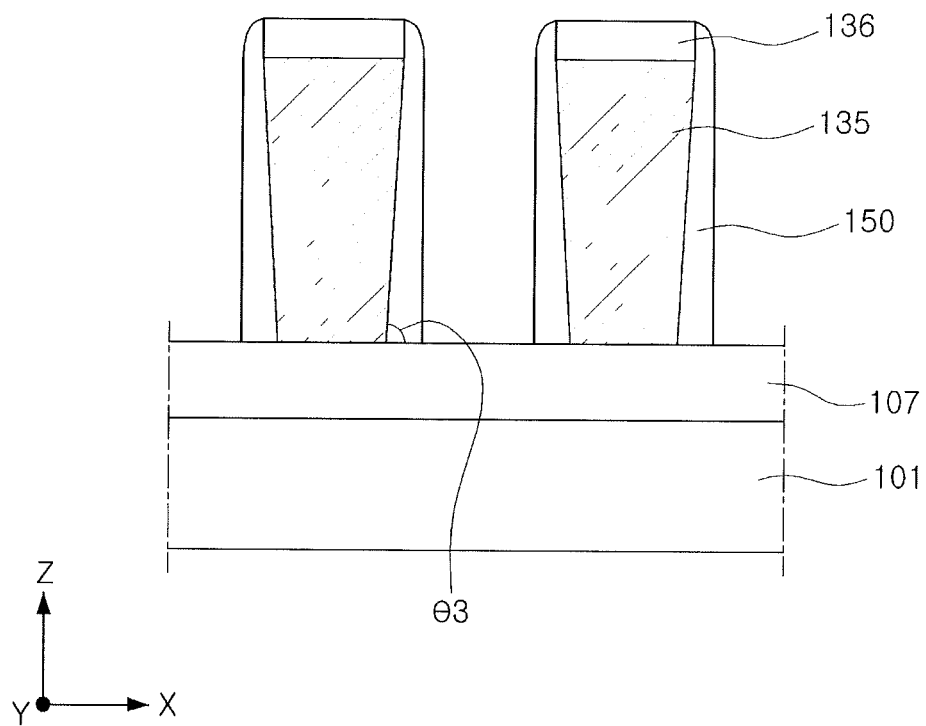
Figure 22:
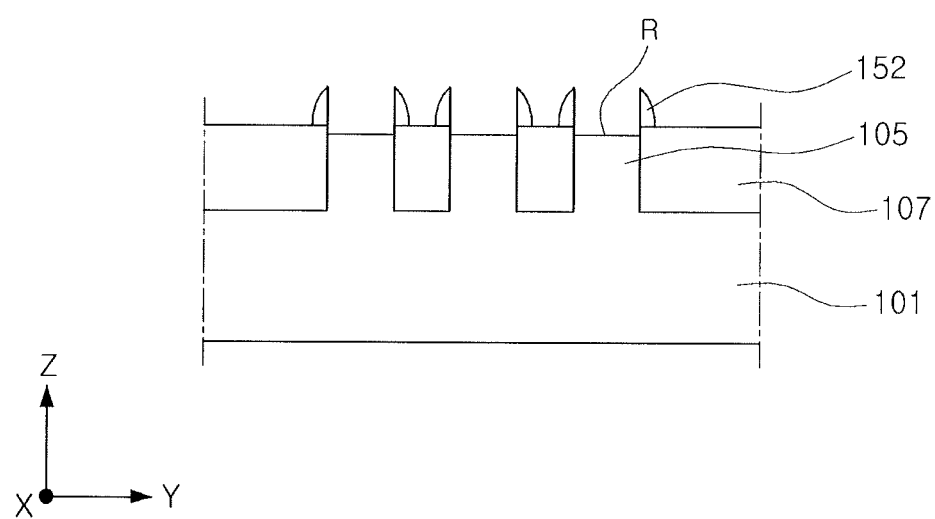

With reference to FIGS. 20 through 22, gate spacers 150 may be formed on both side walls of the sacrificial gate patterns 135, and recess regions R may be formed on the active fins 105 on both sides of the sacrificial gate patterns 135. Fin spacers 152 may be formed on both sides of the recess regions R of the active fins 105.

A process of forming the gate spacers 150 and the fin spacers 152 may include a process in which a spacer material layer is formed to cover the active fins 105 between the sacrificial gate patterns 135 and the device isolation film 107, and to cover the gate mask patterns 136 and the sacrificial gate patterns 135, and the spacer material layer is anisotropically etched thereafter. The spacer material layer may include silicon oxide (SiOx), silicon nitride (SixNy), silicon oxynitride (SiON), silicon oxide containing carbon (SiOC), silicon oxynitride containing carbon (SiOCN), silicon nitride containing carbon and boron (SiBCN), or combinations thereof. The spacer material layer may be formed by performing an atomic layer deposition (ALD) process.

The gate spacers 150 disposed on the active fins 105 and the device isolation film 107 may have widths which increase in a direction perpendicular to an upper surface of the substrate 101. The gate spacers 150 may have widths which increase toward an upper surface of the substrate 101. The gate spacers 150 disposed on the active fins 105 may have widths which increase toward an upper surface of the active fins 105. The gate spacers 150 disposed on the device isolation film 107 may have widths which increase toward an upper surface of the device isolation film 107. The gate spacers 150 may have the largest width in a portion in which the gate spacers are in contact with the device isolation film 107. A first side wall of gate spacers 150, in contact with the sacrificial gate patterns 135, may have a portion inclined with respect to an upper surface of the substrate 101, and a second side wall of gate spacers 150, located opposite the first side wall, may have a portion perpendicular to an upper surface of the substrate 101. The gate spacers 150 may have a pointed upper portion in a region adjacent to the gate mask patterns 136.

The gate spacers 150 and the gate mask pattern 136 are used as an etching mask to remove a portion of the active fins 105, so that the recess regions R may be formed. A lower surface of the recess regions R formed in the active fins 105 may be lower than an upper surface of the device isolation film 107. In an embodiment, a lower surface of the recess regions R formed in the active fins 105 may be formed at a level the same height as or higher than that of an upper surface of the device isolation film 107.

Unlike the recess regions illustrated in the drawing, the recess regions R may have a shape extended below the gate spacer 150. To this end, an isotropic dry or wet etching process may be further performed.

Figure 23:
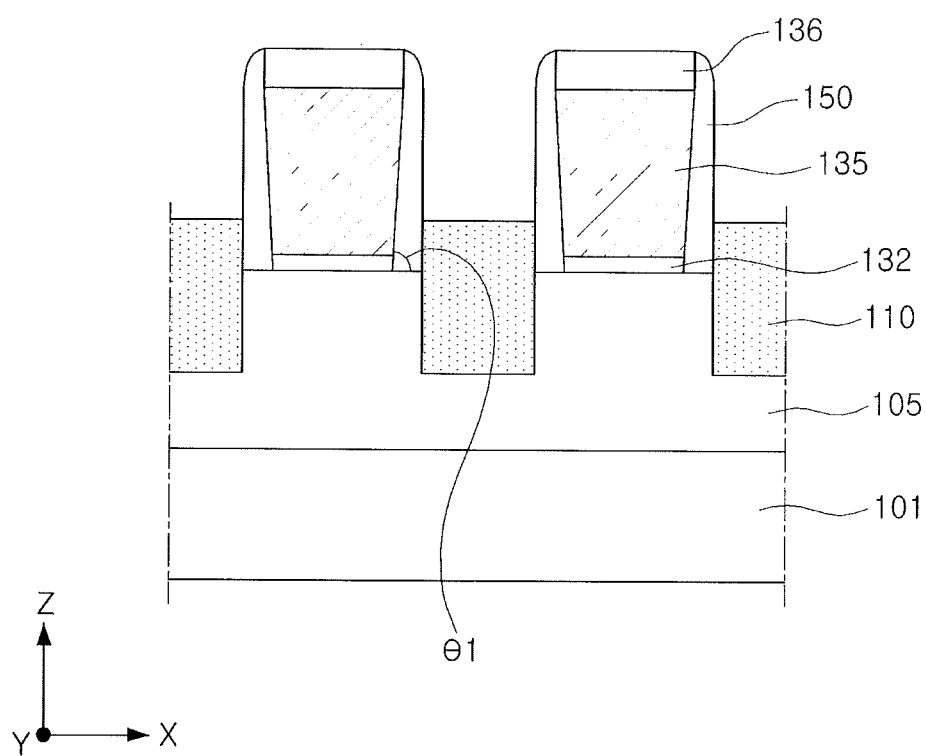
Figure 24:
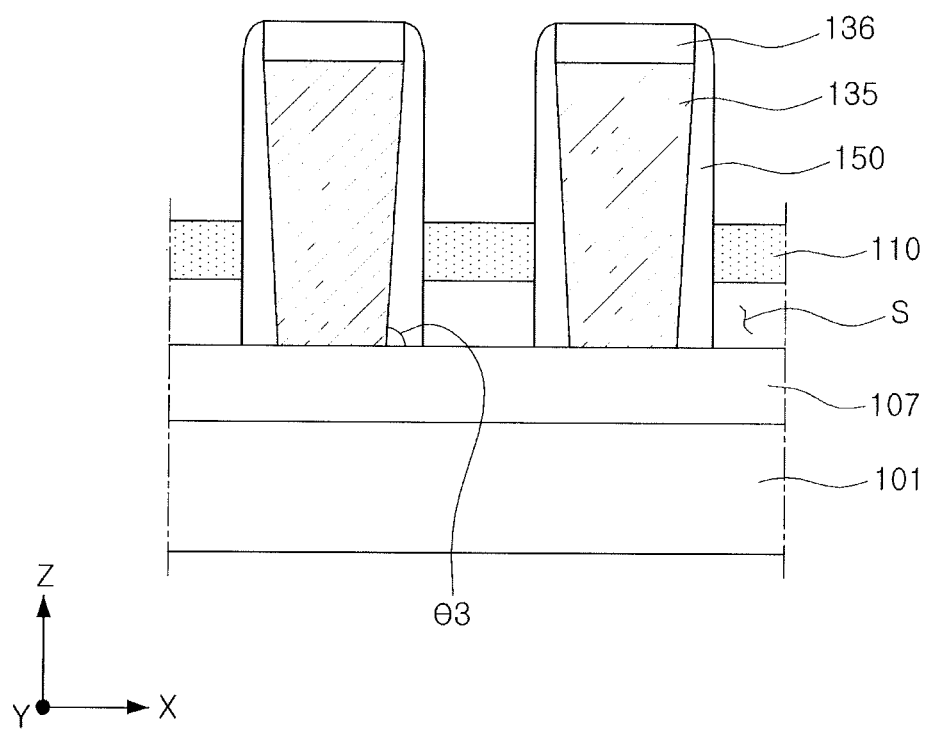
Figure 25:
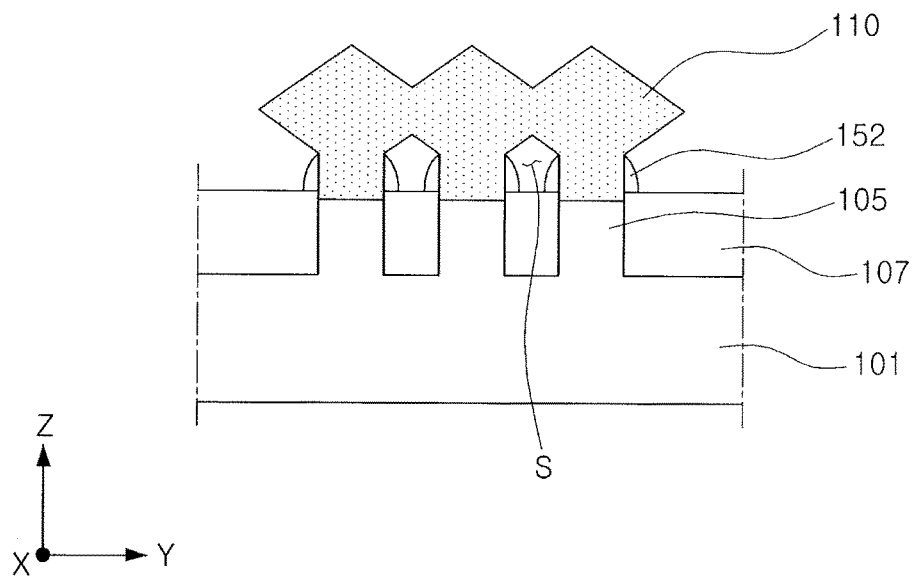

With reference to FIGS. 23 through 25, the source/drain region 110 may be formed in a recess region R.

First, a precleaning process for a Selective Epitaxial Growth (SEG) process with respect to the recess regions R may be performed. The precleaning process may be performed in a wet cleaning process, a dry cleaning process, or combinations thereof. The wet cleaning process may include an isotropic wet etching process using a diluted hydrofluoric acid (HF) or buffered oxide etch (BOE) solution. The dry cleaning process may include an isotropic dry etching process (for example, Siconi™) using an ammonia (NH3) and nitron fluorine three (NF3) gas, or the like. Next, the SEG process is used to grow epitaxial layers filing the recess regions R, so the source/drain regions 110 may be formed. An upper surface of the source/drain regions 110 may be formed in a position higher than an upper surface of the active fins 105. However, a position of the upper surface of the source/drain regions 110 is not limited to what is illustrated. The source/drain regions 110 may be, for example, a silicon (Si) layer or silicon-carbon (SiC) layer doped with an n-type impurity. Alternatively, the source/drain regions 110 may be a silicon-germanium (SiGe) layer containing a p-type impurity. The source/drain regions 110 may be merged with each other on the active fins 105 adjacent to each other. A void S may be formed between a portion, in which the source/drain regions 110 are merged, and the device isolation film 107.

With reference to FIG. 24, in a cross section cut on the device isolation film 107 in the first direction in which the active fins 105 are extended, the void S may be sealed by the source/drain region 110, the gate spacers 150, and the device isolation film 107. A width of the gate spacers 150 adjacent to the device isolation film 107 below the void S is thick, so an electrical short failure between a gate electrode formed subsequently and the source/drain region 110 can be prevented.

Figure 26:
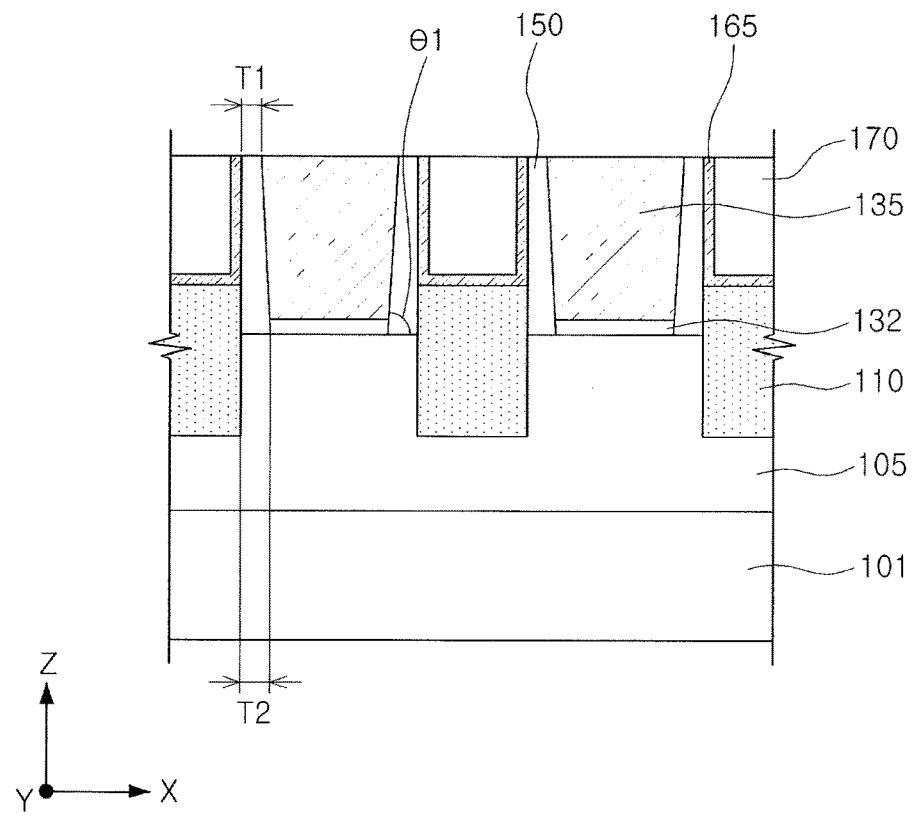
Figure 27:
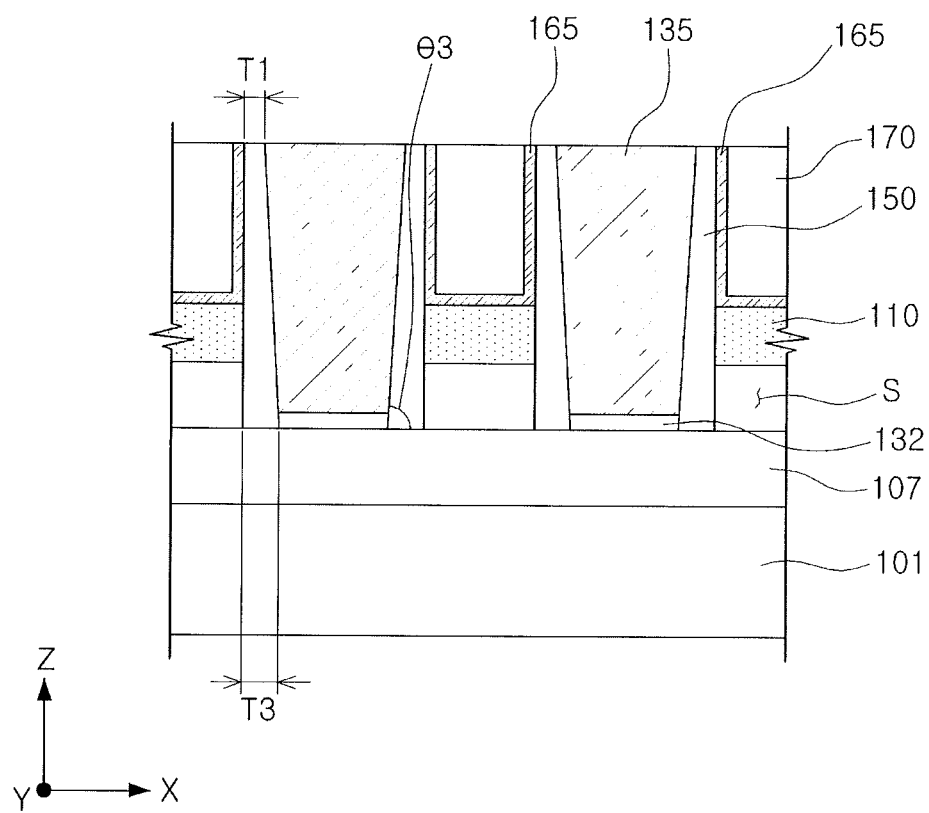
Figure 28:
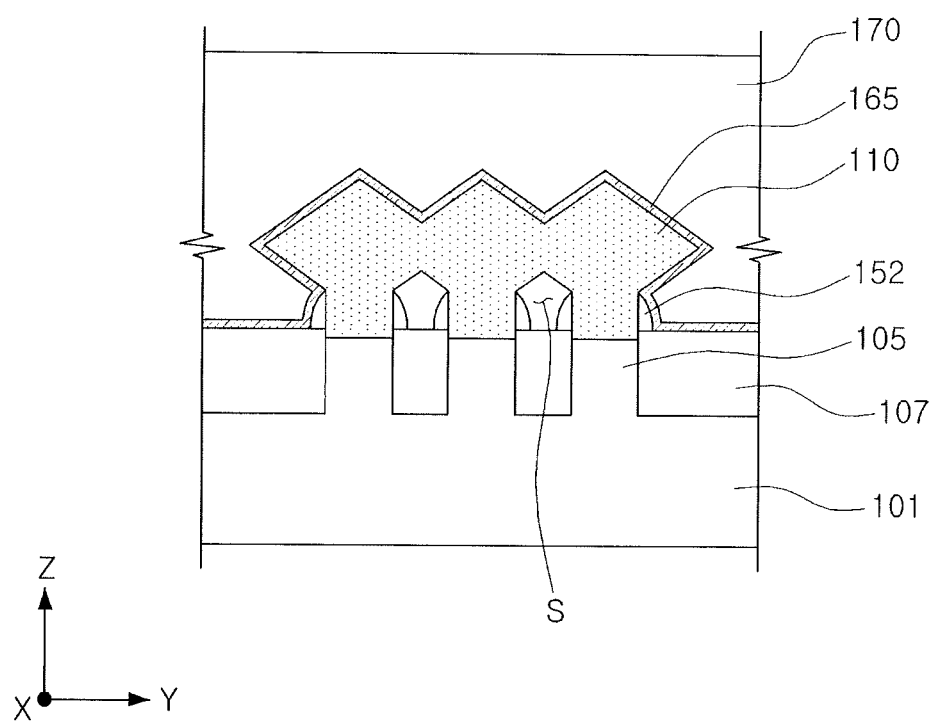

With reference to FIGS. 26 through 28, the etch stop layer 165 is formed on the substrate 101, and the first interlayer insulating layer 170 exposing the sacrificial gate patterns 135 may be formed on the etch stop layer 165.

The gate mask pattern 136, the sacrificial gate pattern 135, the gate spacer 150, and the etch stop layer 165, with a uniform thickness covering the source/drain regions 110, may be formed. The etch stop layer 165 may be formed on the device isolation film 107. The etch stop layer 165 may include silicon nitride. Etch stop layers 165 may be formed in a chemical vapor deposition process or atomic layer deposition process.

After an insulating material layer is formed on the etch stop layer 165, a planarization process is performed to expose a sacrificial gate electrode, so that the first interlayer insulating layer 170 may be formed. In the planarization process, an upper region of the gate spacers 150 may be removed together. An upper end of the gate spacers 150 has a first width T1, gate spacers 150 in contact with the active fins 105 has a second width T2, and gate spacers 150 in contact with the device isolation film 107 has a third width T3. Among first through third widths T1, T2, and T3, the third width T3 is the largest, and the first width T1 is the smallest.

The first interlayer insulating layer 170 may include boro-phospho-sililcate glass (BPSG), tonen silazene (TOSZ), undoped silicate glass (USG), spin on glass (SOG), flowable oxide (FOX), tetra-ethyl-ortho-silicate (TEOS) or high density plasma-CVD (HDP-CVD) oxide, or the like. The first interlayer insulating layer 170 may be formed in a chemical vapor deposition process, a plasma enhanced-CVD (PE-CVD) process, a spin coating process, or an atomic layer deposition process.

Figure 29:
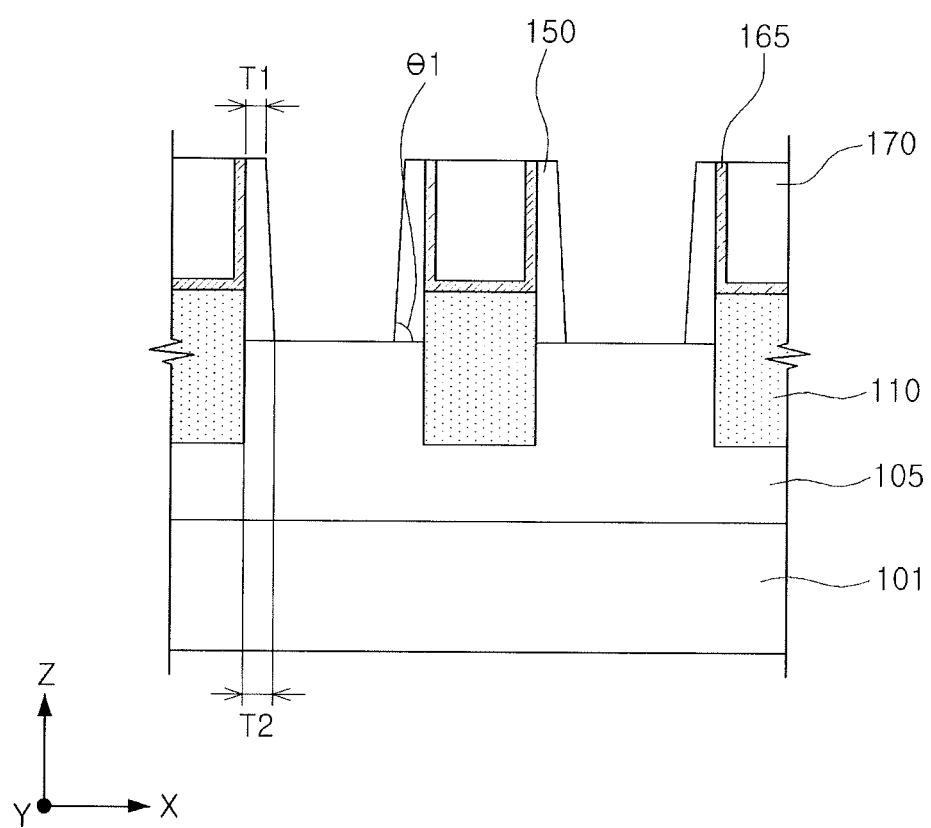
Figure 30:
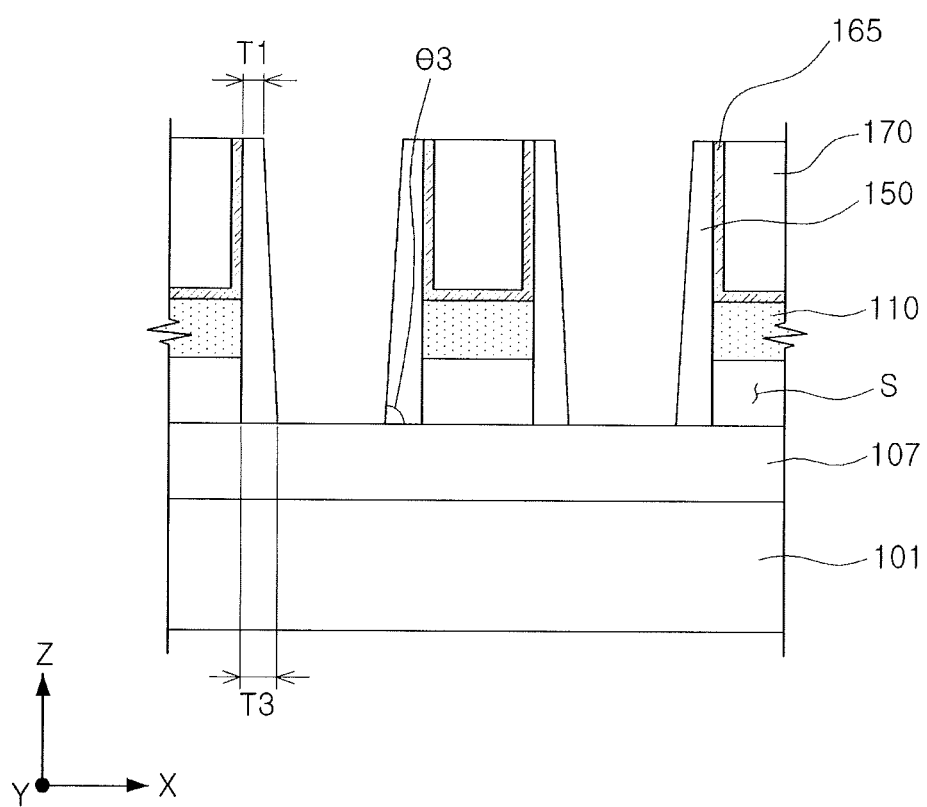

With reference to FIGS. 29 and 30, the sacrificial gate patterns 135 and the sacrificial gate insulating patterns 132 may be selectively removed. Thus, openings partially exposing the active fins 105 may be formed. A process of removing the sacrificial gate patterns 135 and the sacrificial gate insulating patterns 132 may be either a dry etching process or a wet etching process.

With reference to FIGS. 2 through 4, the interfacial insulating layer 141, the gate insulating layer 143, the first gate electrode layer 145, and the second gate electrode layer 147 are sequentially formed inside the openings, and a planarization process is performed, so that the gate structure 140 may be formed. The interfacial insulating layer 141 may not be formed on the device isolation film 107.

Figure 31:
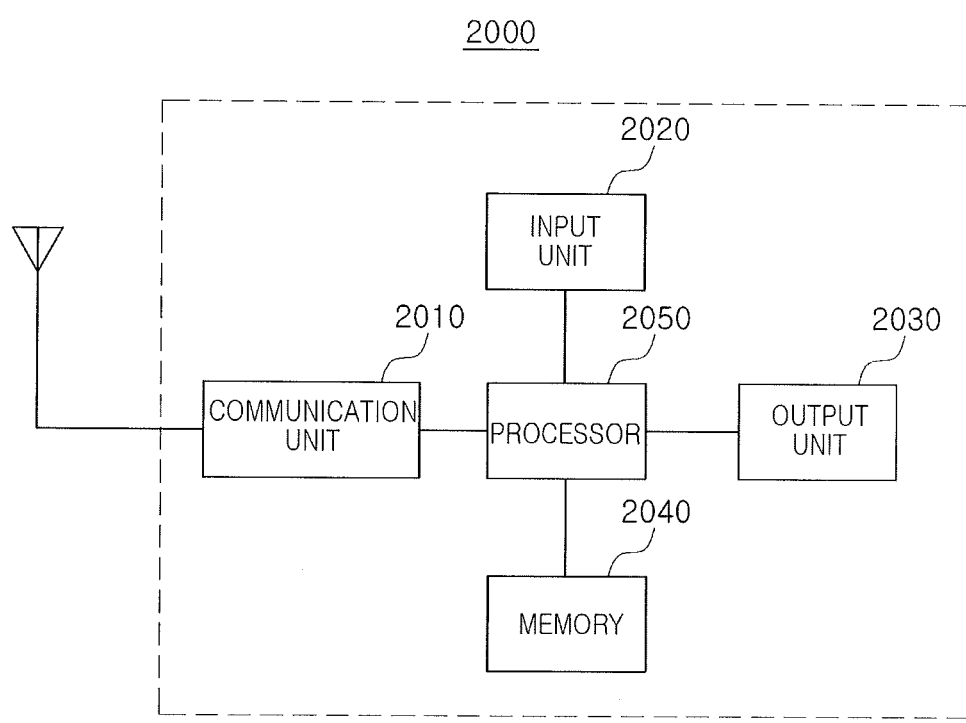
FIG. 31 is a block diagram illustrating an electronic device according to an example embodiment.

FIG. 31 is a block diagram illustrating an electronic device according to an example embodiment.

With reference to FIG. 31, an electronic device 2000 according to an example embodiment may include a communication unit 2010, an input unit 2020, an output unit 2030, a memory 2040, and a processor 2050.

The communication unit 2010 may include a wired/wireless communication module, and may include a wireless Internet module, a local communication module, a GPS module, a mobile communication module, and the like. The wired/wireless communication module included in the communication unit 2010 may be connected to an external communication network by various communication standards to transmit and receive data. The input unit 2020 is a module provided to control an operation of the electronic device 2000 by a user, and may include a mechanical switch, a touch screen, a voice recognition module, and the like. In addition, the input unit 2020 may include a mouse operated with a track ball or a laser pointer, or a finger mouse, and may further include various sensor modules for the user to input data. The output unit 2030 may output information processed in the electronic device 2000 in the form of a voice or an image, and the memory 2040 may store a program for processing and controlling the processor 2050, data, or the like. The processor 2050 may transfer a command to the memory 2040 according to a required operation, so that data may be stored or retrieved. The memory 2040 may be embedded in the electronic device 2000 or may communicate with the processor 2050 through a separate interface. When the memory communicates with the processor 2050 through a separate interface, the processor 2050 may store or retrieve data in the memory 2040 through various interface standards such as SD, SDHC, SDXC, MICRO SD, USB, or the like. The processor 2050 may control an operation of each portion included in the electronic device 2000. The processor 2050 may perform controlling and processing related to voice communication, video communication, data communication, or the like, or may perform controlling and processing for multimedia playback and management. In addition, the processor 2050 may process input transmitted from a user through the input unit 2020 and may output a result through the output unit 2030. In addition, as described previously, the processor 2050 may store data required for controlling an operation of the electronic device 2000 in the memory 2040 or may retrieve data from the memory 2040. At least one of the processor 2050 and the memory 2040 may include a semiconductor device according to various example embodiments, as described previously.

As set forth above, according to example embodiments of the present inventive concept, a width of a lower portion of a gate spacer disposed on a side wall of a gate structure on a device isolation film is formed to be thick, so that a semiconductor device having excellent electrical properties and a method of manufacturing the same may be provided.

While example embodiments have been shown and described above, it will be apparent to those skilled in the art that modifications and variations could be made without departing from the scope of the present disclosure, as defined by the appended claims.

What is claimed is:

1. A semiconductor device, comprising:
an active fin extending in a first direction on a substrate;
a device isolation film disposed on the substrate and covering a lower portion of the active fin;
a gate structure extending in a second direction and covering the active fin and the device isolation film, the second direction being perpendicular with respect to the first direction; and
a gate spacer disposed on a side wall of the gate structure,
wherein the gate structure disposed on the device isolation film has upper and lower portions, a width of the lower portion being narrower than a width of the upper portion;
wherein a side wall of the gate structure disposed on the device isolation film is inclined at a uniform inclination from a point higher than a half of a height of the gate structure to a bottom of the gate structure;
wherein an inner side wall of the gate spacer disposed on the device isolation film is disposed to be adjacent to the gate structure, and is inclined at a uniform inclination from a point higher than a half of a height of the gate spacer to a bottom of the gate spacer and totaling an acute angle with respect to a bottom surface of the gate spacer;
wherein the gate spacer includes a first spacer adjacent to the grate structure, and a second spacer disposed on an outer sidewall of the first spacer; and
wherein the first spacer has a structure bent at a boundary of the gate structure and the device isolation film, and a width of the second spacer increases toward the device isolation film.

2. The semiconductor device of claim 1, wherein an outer side wall of the gate spacer disposed on the device isolation film and an upper surface of the substrate are substantially at a right angle with respect to each other.

3. The semiconductor device of claim 1, wherein a width of the gate spacer increases toward an upper surface of the substrate, and wherein the width is widest at a portion in which the gate spacer is in contact with the device isolation film.

4. The semiconductor device of claim 1:
wherein the gate structure disposed on the device isolation film has an inverted trapezoidal cross section; and
wherein the gate spacer disposed on the device isolation film has a trapezoidal cross section.

5. The semiconductor device of claim 1:
wherein the gate structure disposed on the active fin has upper and lower portions, a width of the lower portion being narrower than a width of an upper portion; and
wherein a side wall of the gate structure disposed on the active fin is inclined with a uniform inclination.

6. The semiconductor device of claim 1:
wherein the gate structure includes a gate insulating layer, a first gate electrode layer, and a second gate electrode layer; and
wherein the gate insulating layer includes a high-k insulating material.

7. The semiconductor device of claim 6:
wherein the gate insulating layer on the device isolation film conformally covers an inner side wall of the gate spacer and an upper surface of the device isolation film; and
wherein the first gate electrode layer conformally covers the gate insulating layer.

8. A semiconductor device, comprising:
a substrate including a first region and a second region;
a first active fin disposed on the first region of the substrate;
a first device isolation film covering a lower portion of the first active fin;

a first gate structure disposed on the first active fin and the first device isolation film;
a first gate spacer disposed on a side wall of the first gate structure;
a second active fin disposed on the second region of the substrate;
a second device isolation film covering a lower portion of the second active fin;
a second gate structure disposed on the second active fin and the second device isolation film; and
a second gate spacer disposed on a side wall of the second gate structure,
wherein a side wall of the first gate structure disposed on the first device isolation film forms a first angle with respect to an upper surface of the substrate;
wherein a side wall of the second gate structure disposed on the second device isolation film forms a second angle with respect to an upper surface of the substrate,
wherein the second angle is greater than the first angle;
wherein a difference between the second angle and the first angle is in a range from 3 degrees to 8 degrees;
wherein the first gate spacer includes a first spacer adjacent to the first gate structure, and a second spacer disposed on an outer sidewall of the first spacer; and
wherein the first spacer has a structure bent at a boundary of the gate structure and the device isolation film, and a width of the second spacer increases toward the device isolation film.

9. The semiconductor device of claim 8, wherein the difference between the second angle and the first angle is in a range from 4 degrees to 7 degrees.

10. The semiconductor device of claim 8:
wherein the first gate spacer has a first side wall and a second side wall opposing each other, and a bottom surface located between the first side wall and the second side wall;
wherein the first side wall adjacent to a side wall of the first gate structure forms an acute angle with respect to the bottom surface; and
wherein the second side wall and the bottom surface are substantially at a right angle with respect to each other.

11. The semiconductor device of claim 8, wherein the substrate further includes a third region and wherein the semiconductor device further comprises:
a third active fin disposed on the third region of the substrate;
a third device isolation film covering a lower portion of the third active fin;
a third gate structure disposed on the third active fin and the third device isolation film; and
a third gate spacer disposed on a side wall of the third gate structure,
wherein a side wall of the third gate structure disposed on the third device isolation film forms a third angle with respect to an upper surface of the substrate; and
wherein the third angle is greater than the second angle.

12. The semiconductor device of claim 11, wherein the third gate spacer has upper and lower portions, a width of the lower portion narrower than a width of the upper portion.

13. A semiconductor device comprising:
an active fin extended in a first direction on a substrate;
a device isolation film disposed on the substrate and covering a lower portion of the active fin;
a gate structure extended in a second direction and covering the active fin and the device isolation film, the second direction being perpendicular with respect to the first direction; and
a gate spacer disposed on a side wall of the gate structure,
wherein an inner side wall of the gate spacer disposed on the device isolation film is disposed to be adjacent to the gate structure, and is inclined at a uniform inclination from a point higher than half of a height of the gate spacer to a bottom of the gate spacer while forming an acute angle with respect to a bottom surface of the gate spacer;
wherein an outer side wall of the gate spacer disposed on the device isolation film and an upper surface of the substrate are substantially at a right angle with respect to each other;
wherein the gate spacer includes a first spacer adjacent to the gate structure, and a second spacer disposed on an outer sidewall of the first spacers; and
wherein the first spacer has a structure bent at a boundary of the gate structure and the device isolation film, and a width of the second spacer increases toward the device isolation film.

14. The semiconductor device of claim 13, wherein a side wall of the gate structure disposed on the device isolation film is inclined at a uniform inclination from a point higher than half of a height of the gate structure to a bottom of the gate structure.

15. The semiconductor device of claim 13, wherein a width of a lower portion of the gate spacer disposed on the device isolation film is narrower wider than a width of a lower portion of the gate spacer disposed on the active fin.

* * * * *